US011018015B2

(12) United States Patent
Ogihara et al.

(10) Patent No.: US 11,018,015 B2
(45) Date of Patent: May 25, 2021

(54) COMPOSITION FOR FORMING ORGANIC FILM, SUBSTRATE FOR MANUFACTURING SEMICONDUCTOR DEVICE, METHOD FOR FORMING ORGANIC FILM, AND PATTERNING PROCESS

(71) Applicant: SHIN-ETSU CHEMICAL CO., LTD., Tokyo (JP)

(72) Inventors: Tsutomu Ogihara, Joetsu (JP); Daisuke Kori, Joetsu (JP); Seiichiro Tachibana, Joetsu (JP); Yusuke Biyajima, Joetsu (JP); Naoki Kobayashi, Joetsu (JP); Kazumi Noda, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 28 days.

(21) Appl. No.: 16/225,347

(22) Filed: Dec. 19, 2018

(65) Prior Publication Data
US 2019/0198341 A1 Jun. 27, 2019

(30) Foreign Application Priority Data
Dec. 26, 2017 (JP) .............................. JP2017-248987

(51) Int. Cl.
*G03F 7/075* (2006.01)
*H01L 21/308* (2006.01)
(Continued)

(52) U.S. Cl.
CPC ........ *H01L 21/3086* (2013.01); *G03F 7/0045* (2013.01); *G03F 7/039* (2013.01);
(Continued)

(58) Field of Classification Search
CPC . C08G 16/0225; C08K 5/0025; G03F 7/0045; G03F 7/039; G03F 7/0752;
(Continued)

(56) References Cited

U.S. PATENT DOCUMENTS

2002/0106909 A1 8/2002 Kato et al.
2004/0191479 A1 9/2004 Hatakeyama et al.
(Continued)

FOREIGN PATENT DOCUMENTS

EP       2474861 A1    7/2012
JP       H09-087220 A  3/1997
(Continued)

OTHER PUBLICATIONS

Jan. 30, 2020 Office Action issued in Korean Patent Application No. 10-2018-0169277.
(Continued)

*Primary Examiner* — Lan Vinh
(74) *Attorney, Agent, or Firm* — Oliff PLC

(57) ABSTRACT

The invention provides: a composition for forming an organic film, the composition having high filterability and enabling formation of an organic film which has high pattern-curving resistance, and which prevents a high-aspect line pattern particularly finer than 40 nm from line collapse and twisting after dry etching; a method for forming an organic film and a patterning process which use the composition; and a substrate for manufacturing a semiconductor device, including the organic film formed on the substrate. The composition for forming an organic film includes a condensate (A), which is a condensation product of dihydroxynaphthalene shown by the following formula (1) and a condensation agent, or a derivative of the condensate (A). A sulfur content among constituent elements contained in the
(Continued)

condensate (A) or the derivative of the condensate (A) is 100 ppm or less in terms of mass.

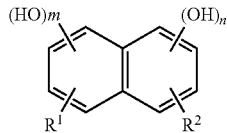

(1)

22 Claims, 2 Drawing Sheets

(51) Int. Cl.
G03F 7/09 (2006.01)
G03F 7/38 (2006.01)
G03F 7/004 (2006.01)
G03F 7/039 (2006.01)
G03F 7/40 (2006.01)
C08K 5/00 (2006.01)
C08G 16/02 (2006.01)

(52) U.S. Cl.
CPC ............ G03F 7/0752 (2013.01); G03F 7/091 (2013.01); G03F 7/094 (2013.01); G03F 7/38 (2013.01); G03F 7/40 (2013.01); H01L 21/3081 (2013.01); H01L 21/3088 (2013.01); C08G 16/0225 (2013.01); C08K 5/0025 (2013.01)

(58) Field of Classification Search
CPC . G03F 7/091; G03F 7/094; G03F 7/38; G03F 7/40; H01L 21/3081; H01L 21/3086; H01L 21/3088; H01L 21/0271

USPC ................. 252/79.1, 79.2, 79.3; 216/41, 42; 430/312, 313
See application file for complete search history.

(56) References Cited

U.S. PATENT DOCUMENTS

| | | |
|---|---|---|
| 2005/0255712 A1 | 11/2005 | Kato et al. |
| 2007/0238300 A1 | 10/2007 | Ogihara et al. |
| 2009/0136869 A1 | 5/2009 | Ogihara et al. |
| 2009/0274978 A1 | 11/2009 | Ohashi et al. |
| 2012/0171868 A1 | 7/2012 | Ogihara et al. |
| 2013/0302990 A1 | 11/2013 | Watanabe et al. |
| 2014/0335692 A1 | 11/2014 | Nonaka et al. |
| 2015/0248057 A1* | 9/2015 | Ohnishi ............ G03F 7/091 430/319 |
| 2017/0003595 A1 | 1/2017 | Aoki et al. |
| 2017/0017156 A1* | 1/2017 | Ogihara ............ H01L 21/0332 |

FOREIGN PATENT DOCUMENTS

| | | |
|---|---|---|
| JP | 2002-334869 A | 11/2002 |
| JP | 2003-177537 A | 6/2003 |
| JP | 2004-310019 A | 11/2004 |
| JP | 2007-302873 A | 11/2007 |
| JP | 2009-126940 A | 6/2009 |
| JP | 2009-269953 A | 11/2009 |
| JP | 2014-106263 A | 6/2014 |
| KR | 1020140132675 A | 11/2014 |
| WO | 2004/066377 A1 | 8/2004 |

OTHER PUBLICATIONS

Jun. 13, 2019 Search Report issued in European Patent Application No. 19150058.6.
J. Abe et al. "SUB-55-NM Etch Process Using Stacked-Mask Process". 2005 Dry Process International Symposium, pp. 11.

* cited by examiner

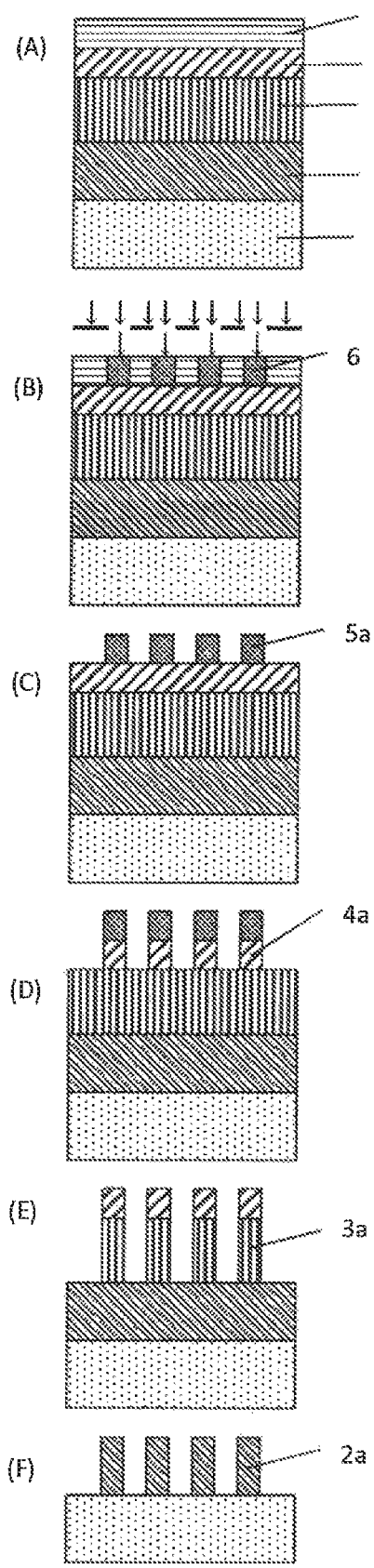

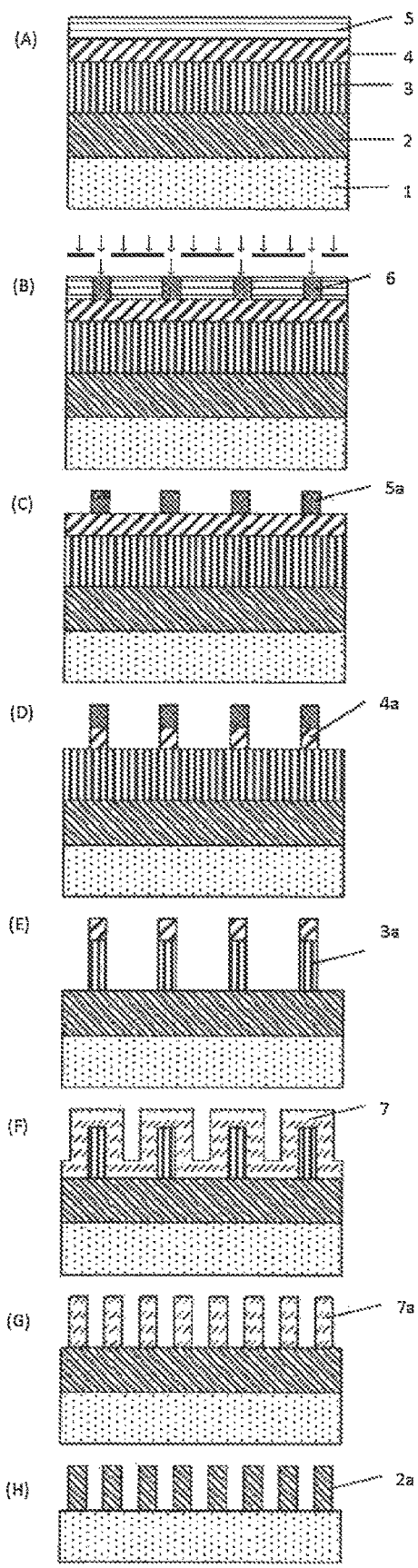
[FIG. 2]

COMPOSITION FOR FORMING ORGANIC FILM, SUBSTRATE FOR MANUFACTURING SEMICONDUCTOR DEVICE, METHOD FOR FORMING ORGANIC FILM, AND PATTERNING PROCESS

TECHNICAL FIELD

The present invention relates to a composition for forming an organic film which is effective as a coating-type organic hard mask used for microfabrication in processes of manufacturing semiconductor elements and the like; a method for forming an organic film and a patterning process which use the composition for forming an organic film; and a substrate for manufacturing a semiconductor device, including the organic film formed on the substrate.

BACKGROUND ART

Recently, along with advancements toward higher integration and higher speed in LSI, a finer pattern rule has been required. In this situation, various techniques have been developed in regard to how patterning process can be performed more finely and precisely with light sources used in lithography with light exposure, which is a commonly-employed technique at present.

Due to such processing line width reduction, phenomena have been reported in which an underlayer film is twisted and/or curved when a substrate to be processed is dry-etched using a mask that is a hard mask mainly containing carbon (Non Patent Literature 1). When such a hard mask is an amorphous carbon (hereinafter CVD-C) film prepared by CVD or ALD, the amount of hydrogen atoms in the film can be reduced quite small, and this film is generally well known to be very effective in preventing the twisting.

Nevertheless, when a substrate to be processed has a step(s), if the substrate to be processed is subjected to the subsequent patterning process by lithography in the presence of the step(s), the process margin such as depth of focus in the lithography process becomes insufficient. For this reason, the step(s) of the substrate need to be planarized with an underlayer film. Planarizing the substrate to be processed using an underlayer film reduces fluctuation in film thickness of a middle layer and a photoresist formed thereon, increases the death of focus in lithography and can increase the process margin.

Meanwhile the CVD-C film using a methane gas, an ethane gas, an acetylene gas, or the like as the raw material is an excellent film for forming an underlayer film having a uniform thickness on a substrate. However, in the case where the substrate has a step(s) thereon, if film thickness does not vary according to the depth of the step to be processed, an underlayer film having a flat surface cannot be formed. Hence, such CVD-C film is not suitable as means for planarizing a stepped substrate.

In such a case, when an organic underlayer film is formed as an underlayer film by spin coating a material for forming an underlayer film containing an organic resin, there are advantages not only that the underlayer film material can fill a step(s) of the substrate, but also that the substrate surface can be planarized. Although such an organic underlayer film has been conventionally utilized as an organic hard mask and an underlayer film in a multilayer resist process, since an organic matter is used as the base material, the anti-twisting property is insufficient in forming a fine pattern in comparison with a CVD-C film. Hence, there are demands for an organic resin for an organic underlayer film having filling and planarizing properties as an organic hard mask and also having twisting resistance equivalent to a CVD-C film.

CITATION LIST

Non Patent Literature

Non Patent Literature 1: Proc. of Symp. Process, (2005) p. 11

SUMMARY OF INVENTION

Technical Problem

The present invention has been made in view of the above problems. An object of the present invention is to provide: a composition for forming an organic film, the composition having high filterability and enabling formation of an organic film which has high pattern-curving resistance, and which prevents a high-aspect line pattern particularly finer than 40 nm from line collapse and twisting after dry etching; a method for forming an organic film and a patterning process which use the composition; and a substrate for manufacturing a semiconductor device, including the organic film formed on the substrate.

Solution to Problem

The present invention provides a composition for forming an organic film, comprising
a condensate (A), which is a condensation product of dihydroxynaphthalene shown by the following formula (1) and a condensation agent, or a derivative of the condensate (A), wherein
a sulfur content among constituent elements contained in the condensate (A) or the derivative of the condensate (A) is 100 ppm or less in terms of mass,

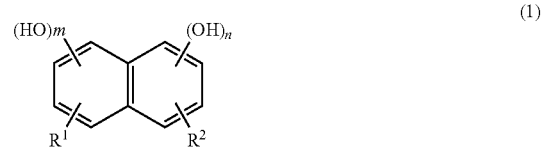

(1)

wherein $R^1$ and $R^2$ each independently represent a hydrogen atom or an optionally substituted, saturated or unsaturated monovalent organic group having 1 to 30 carbon atoms; $0 \leq m \leq 2$, $0 \leq n \leq 2$, and $m+n=2$.

The inventive composition for forming an organic film is a high-filterability composition for forming an organic film, enabling formation of an organic film which has high pattern-curving resistance, and which prevents a high-aspect line pattern particularly finer than 40 nm from line collapse and twisting after dry etching.

The dihydroxynaphthalene is preferably 1,5-dihydroxynaphthalene or 2,7-dihydroxynaphthalene.

The condensation agent is preferably formaldehyde, paraformaldehyde, hydroxybenzaldehyde, or hydroxynaphthylaldehyde.

As described above, when the composition for forming an organic film contains a condensate obtained particularly from 1,5-dihydroxynaphthalene or 2,7-dihydroxynaphthalene as the dihydroxynaphthalene and formaldehyde, paraformaldehyde, hydroxybenzaldehyde, or hydroxynaphthaldehyde as the condensation agent, purification is possible by precise filtration with a filter having openings of 20 nm or less, which is essential for the most advanced processing material for manufacturing a semiconductor device. Besides, it is possible to provide a composition for forming an organic film, allowing formation of an organic underlayer film which prevents line collapse and twisting after dry etching in a high-aspect line pattern finer than 40 nm.

It is preferable to contain a condensate (B) obtained by reacting the condensate (A) with a modification agent shown by the following formula (2),

$$X-R_4-C \equiv C-R_3 \qquad (2)$$

wherein X represents chlorine, bromine, or iodine; $R_3$ represents hydrogen or a monovalent organic group having 1 to 10 carbon atoms; and $R_4$ represents a divalent organic group having 1 to 10 carbon atoms.

Moreover, one or both of the condensate (A) and the condensate (B) preferably contain one or both of an acid generator and a crosslinking agent.

When the condensate (A) and/or the condensate (B) in the inventive composition for forming an organic film contain one or both of an acid generator and a crosslinking agent, possible to promote the crosslinking reaction in the coating film by heating after the application to a substrate and the like. Particularly, the organic film containing the dihydroxynaphthalene structure is capable of forming a fine organic film by heating. The formed organic Film can form a line pattern of 40 nm or less by dry etching processing.

Moreover, the present invention provides a substrate for manufacturing a semiconductor device, comprising an organic film on the substrate, the organic film being formed by curing the above-described composition for forming an organic film.

When a substrate for manufacturing a semiconductor device includes an organic film formed by curing the inventive composition for forming an organic film as described above, the substrate for manufacturing a semiconductor device has high manufacturing yield and includes an organic film which is formed to have high pattern-curving resistance, and which prevents line collapse and twisting after dry etching in a high-aspect line pattern particularly finer than 40 nm.

Further, the present invention provides a method for forming an organic film employed in a semiconductor device manufacturing process, the method comprising:

spin-coating a body to be processed with the above-described composition for forming an organic film; and heating the body to be processed coated with the composition for forming an organic film under an inert gas atmosphere at a temperature of 50° C. or higher to 600° C. or lower within a range of 10 seconds to 7200 seconds to obtain a cured film.

Additionally, a method for forming an organic film employed in a semiconductor device manufacturing process may comprise:

spin-coating a body to be processed with the above-described composition for forming an organic film;

heating the body to be processed coated with the composition for forming an organic film in air at a temperature of 50° C. or higher to 400° C. or lower within a range of 5 seconds to 3600 seconds to form a coating film; and then heating the body to be processed having the formed coating film under an inert gas atmosphere at a temperature of 400° C. or higher to 600° C. or lower within a range of 10 seconds to 7200 seconds to obtain a cured film.

The inert gas to be used preferably has an oxygen concentration of 1% or less.

When the inventive composition for forming an organic film is formed into an organic film by employing these conditions, a fine organic film can be formed. The organic film thus formed makes it possible to form a line pattern of 40 nm or less by dry etching processing, and a line pattern of 25 nm or less depending on the conditions.

Further, the present invention provides a patterning process comprising:

forming an organic film on a body to be processed from the above-described composition for forming an organic film;

forming a silicon-containing resist middle layer film on the organic film from a silicon-containing resist middle layer film composition;

forming a resist upper layer film on the silicon-containing resist middle layer film from a resist upper layer film composition composed of a photoresist composition;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask; and further transferring the pattern to the body to be processed by etching using the organic film having the transferred pattern as a mask.

Furthermore, a patterning process may comprise:

forming an organic film on a body to be processed from the above-described composition for forming an organic film;

forming a silicon-containing resist middle layer film on the organic film from a silicon-containing resist middle layer film composition;

forming a resist upper layer film on the silicon-containing resist middle layer film from a resist upper layer film composition composed of a photoresist composition;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Furthermore, a patterning process may comprise:

forming an organic film on a body to be processed from the above-described composition for forming an organic film;

forming a silicon-containing resist middle layer film on the organic film from a silicon-containing resist middle layer film composition;

forming an organic antireflective film on the silicon-containing resist middle layer film;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the silicon-containing resist middle layer film by etching using the resist upper layer film having the formed circuit pattern as a mask;

transferring the pattern to the organic film by etching using the silicon-containing resist middle layer film having the transferred pattern as a mask; and further transferring the pattern to the body to be processed by etching using the organic film having the transferred pattern as a mask.

Furthermore, a patterning process may comprise:

forming an organic film on a body to be processed from the above-described composition for forming an organic film;

forming a silicon-containing resist middle layer film on the organic film from a silicon-containing resist middle layer film composition;

forming an organic antireflective film on the silicon-containing resist middle layer film;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the silicon-containing resist middle layer film by etching using the resist upper layer film having the formed circuit pattern as a mask;

transferring the pattern to the organic film by etching using the silicon containing resist middle layer film having the transferred pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Furthermore, a patterning process may comprise:

forming an organic film on a body to be processed from the above-described composition for forming an organic film;

forming an inorganic hard mask selected from a silicon oxide film, a silicon nitride film, and a silicon oxynitride film on the organic film;

forming a resist upper layer film on the inorganic hard mask from a resist upper layer film composition composed of a photoresist composition;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and further transferring the pattern to the body to be processed by etching using the organic film having the formed pattern as a mask.

Furthermore, a patterning process may comprise:

forming an organic film on a body to be processed from the above-described composition for forming an organic film;

forming an inorganic hard mask selected from a silicon oxide film, a silicon nitride film, and a silicon oxynitride film on the organic film;

forming a resist upper layer film on the inorganic hard mask from a resist upper layer film composition composed of a photoresist composition;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Furthermore, a patterning process may comprise:

forming an organic film on a body to be processed from the above-described composition for forming an organic film;

forming an inorganic hard mask selected from a silicon oxide film, a silicon nitride film, and a silicon oxynitride film on the organic film;

forming an organic antireflective film on the inorganic hard mask;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the inorganic hard mask by etching using the resist upper layer film having the formed circuit pattern as a mask;

transferring the pattern to the organic film by etching using the inorganic hard mask having the formed pattern as a mask; and further transferring the pattern to the body to be processed by etching using the organic film having the formed pattern as a mask.

Furthermore, a patterning process may comprise:

forming an organic, film on a body to be processed from the above-described composition for forming an organic film;

forming an inorganic hard mask selected from a silicon oxide film, a silicon nitride film, and a silicon oxynitride film on the organic film;

forming an organic antireflective film on the inorganic hard mask;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the inorganic hard mask by etching using the resist upper layer film having the formed circuit pattern as a mask;

transferring the pattern to the organic film by etching using the inorganic hard mask having the formed pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

The inorganic hard mask is preferably formed by a CVD method or an ALD method.

The circuit pattern is preferably formed by a lithography using light with a wavelength ranging from 10 nm to 300 nm, a direct drawing by electron beam, a nanoimprinting, or a combination thereof.

Moreover, when the circuit pattern is formed, the circuit pattern is preferably developed with an alkaline solution or an organic solvent.

The body to be processed is preferably a semiconductor device substrate or the semiconductor device substrate coated with any of a metal film, a metal carbide film, a metal oxide film, a metal nitride film, a metal oxycarbide film, and a metal oxynitride film.

The metal of the body to be processed is preferably silicon, titanium, tungsten, hafnium, zirconium, chromium, germanium, copper, silver, gold, aluminum, indium, gallium, arsenic, palladium, iron, tantalum, iridium, molybdenum, cobalt, or an alloy thereof.

In these manners, when a pattern is formed using the inventive composition for forming an organic film, it is possible to precisely transfer a fine pattern in an upper layer photoresist with a pattern width of 40 nm or less to a body to be processed without twisting and collapsing the pattern, thereby forming the pattern in the body to be processed.

Advantageous Effects of Invention

From the foregoing, the inventive composition for forming an organic film has few soft particles and is excellent in filterability. Moreover, the inventive method for forming an organic film makes it possible to form an organic film which has high pattern-curving resistance in forming a pattern, and which prevents line collapse and twisting after dry etching in a high-aspect line pattern particularly finer than 40 nm.

BRIEF DESCRIPTION OF DRAWINGS

FIG. 1 shows schematic cross-sectional views for illustrating an example of a 3-layer resist processing process.

FIG. 2 shows schematic cross-sectional views for illustrating an example of a patterning process which is a combination of the 3-layer resist processing process and a side wall process.

DESCRIPTION OF EMBODIMENTS

As described above, there have been demands for: a composition for forming an organic film, enabling formation of an organic underlayer film which has high pattern-curving resistance, and which prevents line collapse and twisting after dry etching in a high-aspect line pattern particularly finer than 40 nm; an organic film formed from the composition; and a patterning process using this.

A dihydroxynaphthalene compound (1) is generally produced by the following method in an industrial scale. Specifically, the starting material naphthalene compound (1-1) is sulfonated to form a sulfonic acid compound (1-2). Then, this compound is converted to have hydroxyl groups by alkali fusion, so that the dihydroxynaphthalene compound (1) is obtained.

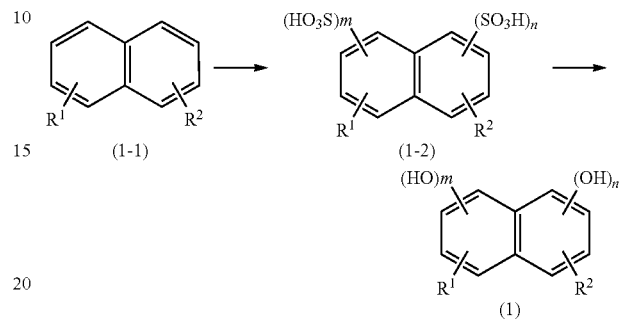

In the formulae, "n", "m", $R^1$, and $R^2$ are as described above.

In this production process, the sulfonic acid compound (1-2) is not completely consumed by the alkali fusion. As a sulfur element content among the constituents elements, the sulfonic acid compound (1-2) in an amount of approximately several hundred ppm to several thousand ppm in terms of mass remains in the dihydroxynaphthalene compound (1) of general industrial grades (hereinafter, the sulfonic acid compound is also referred to as "sulfur content"). Conventionally, industrial-grade dihydroxynaphthalene compounds containing such impurities have been mainly used as dyes. Hence, such impurities have not brought about any problems.

The present inventors have found that a dihydroxynaphthalene condensate is excellent as an organic resin enabling formation of an organic underlayer film which has high pattern-curving resistance, and which prevents line collapse and twisting after dry etching in a high-aspect line pattern particularly finer than 40 nm. Nevertheless, when a composition for forming an organic film for manufacturing a semiconductor device is produced by using industrial-grade dihydroxynaphthalene as the starting material, clogging occurs in the purification step by precise filtration with a filter having openings of 20 nm or less, which is essential for the most advanced processing material for manufacturing a semiconductor device. Hence, it has been difficult to provide the composition as a processing material for manufacturing a semiconductor device.

For example, when the inventive composition for forming an organic film containing a condensate (A) using an industrial-grade dihydroxynaphthalene compound (1) is employed in the process of manufacturing a semiconductor device, the composition has to be purified by precise filtration using a filter having openings of 20 nm or less so as to eliminate defect in coating film or defect after dry etching. Generally, in such precise filtration, the difference in the hydraulic pressure of the composition between before and after the filter needs to be 50 KPa or less, more preferably 40 KPa, for the filtration. When the difference in the hydraulic pressure is increased, foreign matters, which ought to be captured by the filter, pass through pores of the filter and enter the filtrate side by the pressure difference. Thereby, the purification by filtration becomes insufficient. This causes a large number of defects in coating or after etching, decreasing the yield in manufacturing a semiconductor device.

The present invention aims at reducing not hard foreign matters (hereinafter referred to as hard particles) contained in the condensate (A) but soft foreign matters (hereinafter referred to as soft particles) deformable by a weak force due to solvent incorporation. When composition containing hard particles is filtered through a fine filter, the hard particles are captured on the filter surface. Even when the hard particles are captured on the filter surface, the passage amount during the filtration hardly changes owing to gaps among the hard particles, so that the ability to produce the composition maintained. On the other hand, when a solution containing soft particles is filtered through fine filter, the soft particles captured on the filter surface are deformed in accordance with the flow of the solution, so that gaps among the soft particles disappear. This makes it difficult to pass the solution through the filter, decreasing the ability to produce the composition. The filter consequently clogs, and the filter needs to be replaced. When such filter replacement is repeated, filters for producing the composition are consumed in uneconomically large quantities. Meanwhile, when the hydraulic pressure is increased to guarantee the passage amount, the soft particles are deformed and pass through the pores of the filter. After passing through the filter, the soft particles contaminate the product. If the product contaminated with the soft particles is used to produce a semiconductor device, defects in coating or after dry etching are increased, decreasing the yield in manufacturing a semiconductor device.

As described above, if a composition for forming an organic film contains soft particles, the soft particles decrease the productivity in the process of producing the composition for forming an organic film, or decrease the yield of the semiconductor manufacturing apparatus in some cases. Thus, soft particle generation needs to be prevented.

The present inventors have earnestly studied to achieve the above-described object and consequently found that when compositions for forming an organic film contain a condensate and a derivative of the condensate, which is produced after purification such that the amount of a sulfonic acid compound contained in a dihydroxynaphthalene compound as the starting material is 100 ppm or less in terms of sulfur content, purification is possible by precise filtration with a filter having openings of 20 nm or less, which is essential for the most advanced processing material for manufacturing a semiconductor device. This finding has led to the completion of the present invention.

Hereinafter, embodiments of the present invention will be described, but the present invention is not limited thereto.

Composition for Forming Organic Film

The present invention is a composition for forming an organic film, comprising a condensate (A), which is a condensation product of dihydroxynaphthalene shown by the following formula (1) and a condensation agent, or a derivative of the condensate (A), wherein a sulfur content among constituent elements contained in the condensate (A) or the derivative of the condensate (A) is 100 ppm or less in terms of mass,

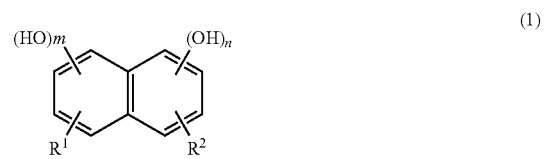

wherein $R^1$ and $R^2$ each independently represent a hydrogen atom or an optionally substituted saturated or unsaturated monovalent organic group having 1 to 30 carbon atoms; $0 \leq m \leq 2$, $0 \leq n \leq 2$, and $m+n=2$.

Here, the dihydroxynaphthalene represented by the general formula (1) includes 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 1,2-dihydroxy-4-methylnaphthalene, 1,3-dihydroxy-2-methylnaphthalene, 1,3-dihydroxy-4-methylnaphthalene, 2,3-dihydroxy-1-methylnaphthalene, 1,4-dihydroxy-2-methylnaphthalene, 1,5-dihydroxy-2-methylnaphthalene, 1,5-dihydroxy-4-methylnaphthalene, 1,6-dihydroxy-2-methylnaphthalene, 1,6-dihydroxy-4-methylnaphthalene, 1,6-dihydroxy-4,5-dimethylnaphthalene, 2,6-dihydroxy-1-methylnaphthalene, 2,6-dihydroxy-1,5-dimethylnaphthalene, 1,7-dihydroxy-4-methylnaphthalene, 1,7-dihydroxy-8-methylnaphthalene, 1,7-dihydroxy-4,8-dimethylnaphthalene, 2,7-dihydroxy-1-methylnaphthalene, 2,7-dihydroxy-3-methylnaphthalene, 2,7-dihydroxy-1,6-dimethylnaphthalene, 1,8-dihydroxy-4-methylnaphthalene, 1,8-dihydroxy-4,5-dimethylnaphthalene, and the like. The dihydroxynaphthalene is preferably 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, and 1,8-dihydroxynaphthalene. Particularly preferably, the dihydroxynaphthalene is 1,5-dihydroxynaphthalene or 2,7-dihydroxynaphthalene.

As described above, the dihydroxynaphthalene compound (1) is industrially produced by the following method in general. Specifically, the starting material naphthalene compound (1-1) is sulfonated to form the sulfonic acid compound (1-2). Then, this compound is converted to have hydroxyl groups by alkali fusion, so that the dihydroxynaphthalene compound (1) is obtained).

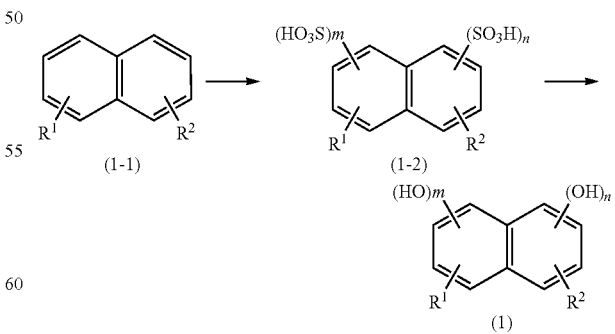

In the formulae, "n", "m", and $R^2$ are as described above.

In this event, the sulfonic acid compound (1-2) is not completely consumed by the alkali fusion. As the sulfur element content among the constituents elements, the sulfonic acid compound (1-2) remains in an amount of approximately several hundred ppm to several thousand ppm in terms of mass in the dihydroxynaphthalene compound (1) of general industrial grades. The method for removing (1-2) from dihydroxynaphthalene compounds of industrial grades containing such impurities includes a method involving dissolving a dihydroxynaphthalene compound (1) into an organic solvent and washing the resultant with an aqueous alkaline solution, followed by liquid separation; a method involving removing the component (1-2) by an adsorption treatment with an adsorbent such as activated carbon, silica gel, or alumina; and the like. Among these, the method involving the adsorbent treatment is preferable, and the adsorption treatment with activated carbon or alumina is particularly preferable.

As the method for quantifying the sulfur content in the dihydroxynaphthalene compound (1), there are known a combination method of sample combustion and titration, a combination method of sample combustion and ion chromatography, inductively coupled plasma emission spectroscopy (ICP-AES/OES), and the like. The method for quantifying the sulfur content in the dihydroxynaphthalene compound (1) after impurity removal is preferably ICP-AES/OES which is more highly sensitive.

Examples of the condensation agent include formaldehyde, trioxane, paraformaldehyde, acetaldehyde, propylaldehyde, adamantanecarbaldehyde, benzaldehyde, hydroxybenzaldehyde, phenylacetaldehyde, α-phenylpropylaldehyde, β-phenylproplaldehyde, o-chlorobenzaldehyde m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, 6-hydroxy-2-naphthylaldehyde, anthracenecarbaldehyde, pyrenecarbaldehyde, furfural, methylal, and the like. Preferable examples include formaldehyde, paraformaldehyde, 4-hydroxybenzaldehyde, and 6-hydroxy-2-naphthylaldehyde.

As the ratio between the dihydroxynaphthalene compound (1) and the condensation agent, the condensation agent is preferably 0.01 to 5 moles, more preferably 0.05 to 2 moles, relative to 1 mole of the dihydroxynaphthalene compound (1).

The polycondensation reaction for obtaining the condensate (A) by using the raw materials as described above can be performed normally without a solvent or in a solvent using an acid or a base as a catalyst at room temperature or if necessary under cooling or heating.

The solvent used during the polycondensation reaction includes alcohols such as methanol, ethanol, isopropyl alcohol, butanol, ethylene glycol, propylene glycol, diethylene glycol, glycerol, methyl cellosolve, ethyl cellosolve, butyl cellsolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethyl formamide, and hexamethyl phosphoric triamide. These can be used alone or in a mixture of two or more kinds. These solvents can be used within a range of 0 to 2,000 parts by mass relative to 100 parts by mass of the reaction raw materials.

As the acid catalyst used during the polycondensation reaction, it is possible to use inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromlde, titanium(IV) methoxide, titanium(IV) ethoxide, titanium (IV) isopropoxide, and titanium(IV) oxide. Moreover, as the base catalyst used during the polycondensation reaction, it is possible to use inorganic bases such as sodium hydroxide, potassium hydroxide, barium hydroxide, sodium carbonate, sodium hydrogen carbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium t-butoxide; and organic bases such as triethylamine, diisopropyl ethyl amine, N,N-dimethylaniline, pyridine, and 4-dimethylaminopyridine.

The amount of these catalysts used is within a range of preferably 0.001 to 100 mass %, more preferably 0.005 to 50 mass %, relative to the raw materials. The reaction temperature of the polycondensation reaction is preferably about −50° C. to the boiling point of the solvent, further preferably room temperature to 100° C.

The polycondensation reaction method includes: a method in which dihydroxynaphthalene compound (1), the condensation agent, and the catalyst are charged at once: a method in which the condensation agent is added dropwise to a mixed solution of the catalyst and the dihydroxynaphthalene compound (1); a method in which the catalyst is added dropwise to a mixture of the dihydroxynaphthalene compound (1) and the condensation agent; and the like.

After completion of the polycondensation reaction, an unreacted raw material, catalyst, and so forth present in the system are removed by selecting a method in accordance with the properties of the obtained reaction product. The method includes a method in which the temperature of the reaction vessel is increased to 130 to 230° C. to remove volatile components at about 1 to 50 mmHg; a method in which appropriate solvent and/or water are added to fractionate the polymer; a method in which the polymer is dissolved in a good solvent and then reprecipitated in a poor solvent; and the like.

As the molecular weight of the obtained condensate (A) in terms of polystyrene, the weight average molecular weight (Mw) is preferably 500 to 500,000, more preferably 1,000 to 100,000. The molecular weight dispersity preferably usable is within a range of 1.2 to 20. When monomer components, oligomer components, or low-molecular-weight components having a molecular weight (Mw) of 1,000 or less are cut, volatile components can be reduced during baking, so that contamination around a baking cup and surface defect due to drop of volatile components can be prevented.

The inventive composition for forming an organic film may contain, as the derivative of the condensate (A), a condensate (B) obtained by reacting a hydroxy group of the condensate (A) with a modification agent shown by the following formula (2), $$X-R_4-C\equiv C-R_3 \quad (2)$$

where X represents chlorine, bromine, or iodine; $R_3$ represents hydrogen or a monovalent organic, group having 1 to 10 carbon atoms; and $R_4$ represents a divalent organic group having 1 to 10 carbon atoms.

Further, the inventive composition for forming an organic film may contain derivatives of the obtained condensates (A) and (B) in each of which a fused aromatic or alicyclic substituent is introduced.

Here, the substituent which can be introduced to the condensates (A) and (B) specifically includes the following.

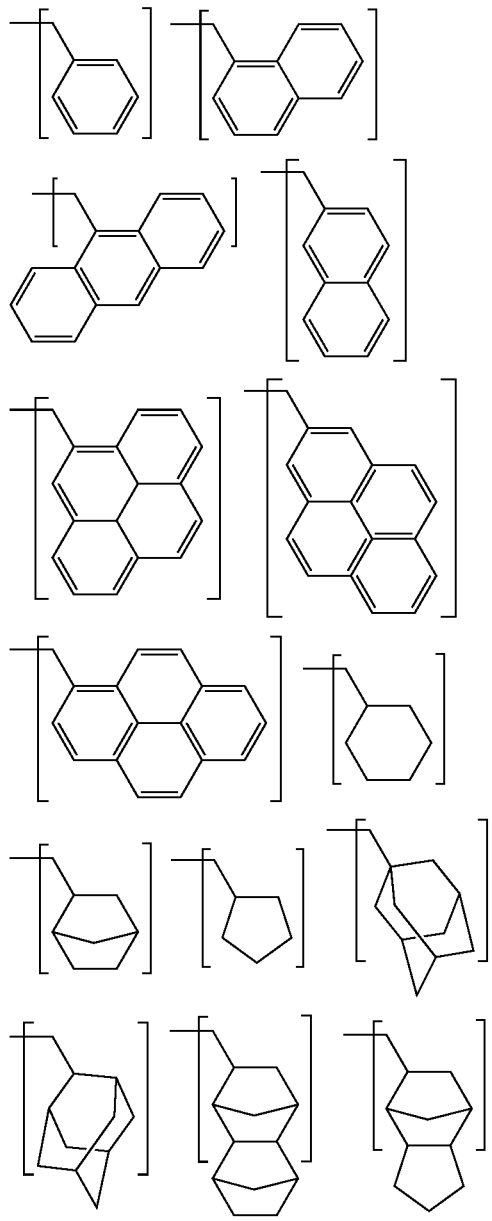

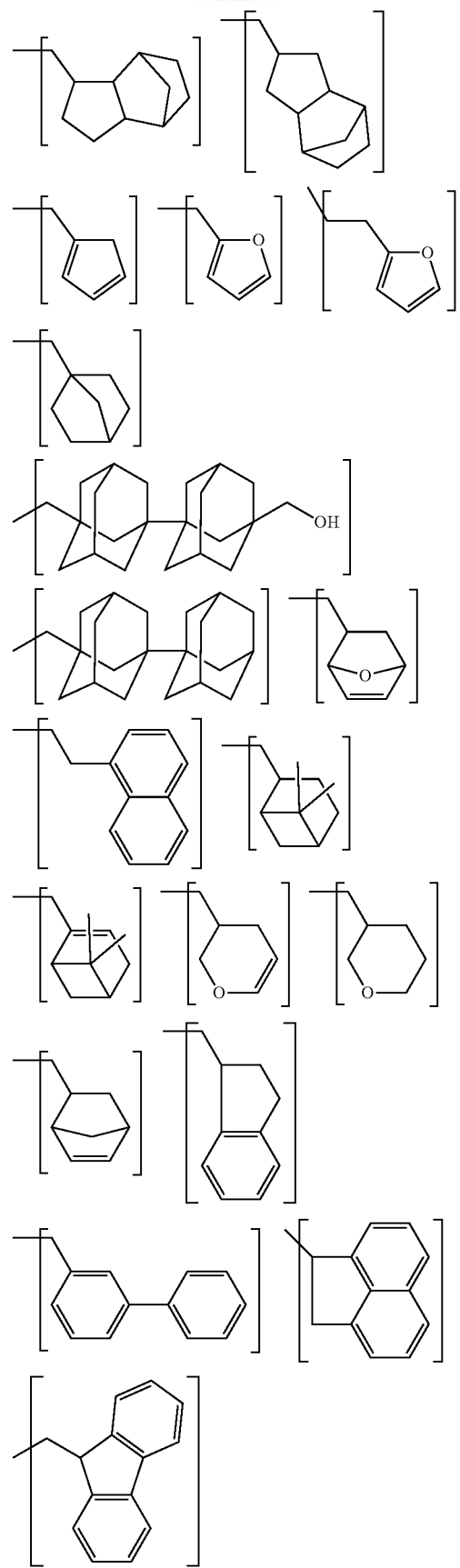

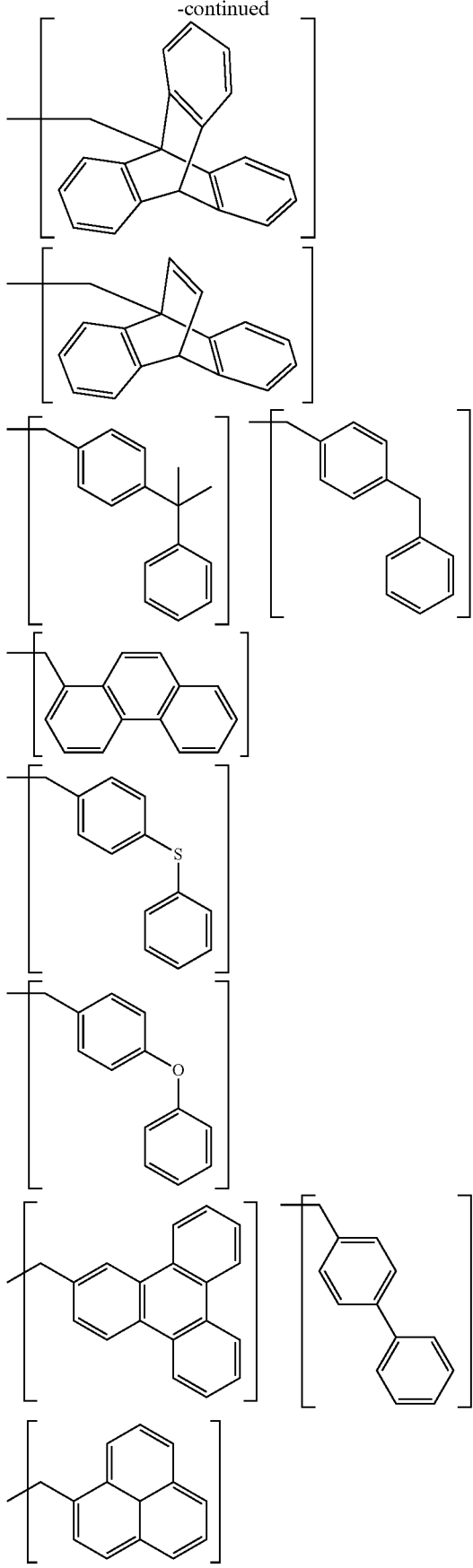

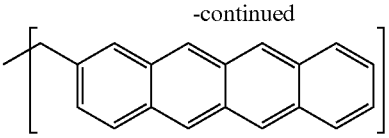

Among these, for 248-nm light exposure, polycyclic aromatic groups, for example, an anthracenemethyl group and a pyrenemethyl group are most preferably used. To improve transparency for light exposure at 193 nm, those having an alicyclic structure and those having a naphthalene structure are preferably used. These aromatic rings are preferably used because of the additional effect of improving etching resistance.

The method for introducing the substituent includes a method in which an alcohol whose hydroxy group is the bonding position of the substituent is introduced to the condensate (A) or (B) at an ortho-position or a para-position relative to a hydroxyl group or an alkyl group thereof in presence of an acid catalyst through an aromatic electrophilic substitution reaction mechanism. As the acid catalyst used when the substituent is introduced, it is possible to use acid catalysts such as hydrochloric acid, nitric acid, sulfuric acid, formic acid, oxalic acid, acetic acid, methanesulfonic acid, n-butanesulfonic acid, camphorsulfonic acid, tosylic acid, and trifluoromethanesulfonic acid. These acid catalysts are used in an amount of 0.001 to 20 parts by mass relative to 100 parts by mass of the polymer before the reaction. The amount of the substituent introduced is within a range of 0 to 0.8 moles relative to 1 mole of monomer units in the polymer.

Further, another polymer can also be blended. The blend polymer includes known underlayer film materials, novolak resins, and the like. A mixture of these serves to improve the film formation by spin coating and the filling property for a stepped substrate. Moreover, a material having high carbon density and high etching resistance can be selected.

Specific examples of the known novolak resins that can be blended include condensation-dehydration compounds obtained by condensation of formaldehyde with phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2- naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, hydroxyindene, hydroxyanthracene, bisphenol, trisphenol, and the like; polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof; and the like.

Further, it is also possible to blend a nortricyclene copolymer, a hydrogenated-naphthol novolak resin, a naphthol dicyclopentadiene copolymer, a phenol dicyclopentadiene copolymer, fluorene bisphenol novolak, acenaphthylene copolymer, an indene copolymer, fullerene having a phenolic group, a bisphenol compound and a novolak resin thereof, a dibisphenol compound and a novolak resin thereof, a novolak resin of an adamantane phenol compound, a hydroxyvinylnaphthalene copolymer, a bisnaphthol compound and a novolak resin thereof, a ROMP polymer, a resin compound represented by a tricyclopentadiene copolymer, and a fullerene resin compound.

The blend compound or the blend polymer is blended in an amount of 0 to 1000 parts by mass, preferably 0 to 500 parts by mass, relative to 100 parts by mass of total of the condensate (A) and the condensate (B).

As the crosslinking agent usable in the present invention, it is possible to add materials described in paragraphs (0056) to (0062) of Japanese Unexamined Patent Application Publication No. 2014-106263.

In the present invention, an acid generator can be added in order to further promote the crosslinking reaction by heating. The acid generator includes materials that generate an acid by thermal decomposition, and materials that generate an acid by light irradiation. Any of these can be added. Specifically, it is possible to add materials described in paragraphs (0063) to (0090) of Japanese Unexamined Patent Application Publication No. 2014-106263.

Further, the inventive composition for forming an organic film can be blended with a basic compound for improving the storage stability. The basic compound serves as a quencher for an acid to prevent crosslinking reaction from progressing by a trace amount of an acid generated by the acid generator. As such a basic compound, it is possible to add specifically materials described in paragraphs (0091) to (0098) of Japanese Unexamined Patent Application Publication. No. 2014-106263.

The organic solvent usable in the inventive composition for forming an organic film is not particularly limited, as long as it dissolves the above-described base polymer, acid generator, crosslinking agent, other additives, and so forth. Specifically, it is possible to add solvents described in paragraphs (0099) to (0100) of Japanese Unexamined Patent Application Publication No. 2014-106263.

To the inventive composition for forming an organic film, a surfactant can also be added in order to improve the coatability by spin coating. As the surfactant, it is possible to use ones described in paragraphs (0142) to (0147) of Japanese Unexamined Patent Application Publication No. 2009-269953.

As described above, the inventive composition for forming an organic film has few soft particles and is excellent in filterability and suitably usable as a material for an organic film which has high pattern-curving resistance in forming a pattern, and which prevents high-aspect line pattern particularly finer than 40 nm from line collapse and twisting after dry etching.

Substrate for Manufacturing Semiconductor Device

Additionally, the present invention provides a substrate for manufacturing a semiconductor device, including an organic film on the substrate, the organic film being formed by curing the above-described composition for forming an organic film.

Method for Forming Organic Film

Moreover, the present invention provides a method for forming an organic film employed in a semiconductor device manufacturing process, the method including:

spin-coating a substrate to be processed with the above-described inventive composition for forming an organic film; and heating the body to be processed coated with the composition for forming an organic film under an inert gas atmosphere at a temperature of 50° C. or higher to 600° C. or lower within a range of 5 seconds to 7200 seconds to obtain a cured film.

Further, the present invention provides a method for forming an organic film employed in a semiconductor device manufacturing process, the method including:

spin-coating a substrate to be processed with the above-described inventive composition for forming an organic film;

heating the body to be processed coated with the composition for forming an organic film in air at a temperature of 50° C. or higher to 400° C. or lower within a range of 5 seconds to 3600 seconds to form a coating film; and then heating the body to be processed having the formed coating film under an inert gas atmosphere at a temperature of 400° C. or higher to 600° C. or lower within a range of 10 seconds to 7200 seconds to obtain a cured film.

In these methods for forming an organic film, first, a substrate to be processed is spin-coated with the above-described inventive composition for forming an organic film. By employing the spin coating method, favorable filling property can be obtained. After the spin coating, baking (heating) is performed to promote the planarization attributable to thermal flow and the crosslinking reaction. Note that since this baking allows the solvent in the composition to evaporate, even when a resist upper layer film or a silicon-containing resist middle layer film is formed on the organic film, the mixing can be prevented.

The film formation step by heating to form an organic film can employ 1-stage baking, 2-stage baking, or multi-stage baking of three or more stages. Nevertheless, the 1-stage baking or 2-stage baking is economically preferable when the final baking temperature is 400° C. or lower. When the final baking temperature is 400° C. or higher, the 2-stage baking or 3-stage baking is preferably in view of the performance of the organic film.

The film formation by the 1-stage baking is preferably performed under an inert gas atmosphere at a temperature of 50° C. or higher to 600° C. or lower within a range of 10 to 7200 seconds, and more preferably performed at a temperature of 50° C. or higher to 400° C. or lower within a range of 5 to 3600 seconds. Heating under such conditions can promote the crosslinking reaction.

In the film formation by the 2-stage baking, first, the first baking is preferably performed at a temperature of 50° C. or higher to 400° C. or lower within a range of 5 to 3600 seconds, and more preferably performed at a temperature of 50° C. or higher to 390° C. or lower within a range of 5 to 600 seconds. Then, the second baking is performed in air, the second baking is preferably performed at a temperature of the first baking temperature or higher to 400° C. or lower within a range of 5 to 600 seconds. Meanwhile, if the second baking is performed in an inert gas, the second baking is preferably performed at a temperature of 400° C. or higher to 600° C. or lower within a range of 10 to 7200 seconds. Not only does heating under such conditions promote the crosslinking reaction, but also the heating in an inert gas enables an organic film which prevents a high-aspect line pattern finer than 30 nm from line collapse and twisting after etching.

In the film formation by the 3-stage baking, first, the first baking is performed at a temperature of 50° C. or higher to 390° C. or lower within a range of 5 to 3600 seconds; then, the second baking is performed at a temperature of the first baking temperature or higher to 400° C. or lower within a range of 5 to 600 seconds, preferably. Subsequently, the third baking is performed preferably in an inert gas at a temperature of the second baking temperature or higher to 600° C. or lower within a range of 10 to 7200 seconds. Not only does heating under such conditions promote the crosslinking reaction, but also the heating in an Inert gas enables an organic film which prevents a high-aspect line pattern finer than 30 nm from line collapse and twisting after etching.

In a multilayer resist method, a coating-type silicon middle layer film or a CVD hard mask is sometimes formed on a film obtained by this film formation step by heating. In the case where a coating-type silicon middle layer film is employed, the film formation is preferably performed at a temperature higher than a temperature at which the silicon middle layer film is formed. Normally, the silicon middle layer film is formed at 100° C. or higher to 400° C. or lower, preferably 150° C. or higher to 350° C. or lower. Forming the organic film at a temperature higher than these temperatures makes it possible to prevent a composition for forming the silicon middle layer film from dissolving the organic film, and to form the organic film not mixed with the composition. In the case where a CVD hard mask is employed, the organic film is preferably formed at a temperature higher than a temperature at which the CVD hard mask is formed. The temperature at which the CVD hard mask is formed can range from 150° C. or higher to 500° C. or lower.

In addition, the inert gas used in the film formation step by heating preferably has an oxygen concentration of 1% or less to prevent the body to be processed from corroding.

Note that the thickness of the organic film to be formed is appropriately selected, and is preferably 5 to 1000 nm, particularly preferably 10 to 500 nm.

Patterning Processes

3-Layer Resist Method Using Silicon-Containing Resist Middle Layer Film

Moreover, the present invention provides a patterning process including:

forming an organic film on a body to be processed from the above-described inventive composition for forming an organic film;

forming a silicon-containing resist middle layer film on the organic film from a silicon-containing resist middle layer film composition;

forming a resist upper layer film on the silicon-containing resist middle layer film from a resist upper layer film composition composed of a photoresist composition;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask; and further transferring the pattern to the body to be processed by etching using the organic film having the transferred pattern as a mask.

As the body to be processed, it is preferable to use a semiconductor device substrate or the semiconductor device substrate coated with any of a metal film, a metal carbide film, a metal oxide film, a metal nitride film, a metal oxycarbide film, and a metal oxynitride film. More specifically, although not particularly limited, the body to be processed includes substrates made of Si, α-Si, p-Si, $SiO_2$, SiN, SiON, W, TiN, Al, or the like; the substrates each coated with these metal films or the like as a layer to be processed; and the like.

As the layer to be processed, used are various Low-k films made of Si, $SiO_2$, SiON, SiN, p-Si, α-Si, N, W—Si, Al, Cu, Al—Si, or the like, and stopper films thereof. The layer can be formed to have a thickness of generally 50 to 10,000 nm, particularly 100 to 5,000 nm. Note that when the layer to be processed is formed, the substrate and the layer to be processed are formed from different materials.

Note that the metal of the body to be processed is preferably silicon, titanium, tungsten, hafnium, zirconium, chromium, germanium, copper, silver, gold, aluminum, indium, gallium, arsenic, palladium, iron, tantalum, iridium, molybdenum, cobalt, or an alloy thereof.

When the inventive composition for forming an organic film is used to form the organic film on the body to be processed, the above-described inventive method for forming an organic film may be employed.

Next, using a resist middle layer film composition containing silicon atoms, a resist middle layer film (silicon-containing resist middle layer film) is formed on the organic film. As the silicon-containing resist middle layer film composition, a polysiloxane-based middle layer is preferably used. The silicon-containing middle layer film having antireflective effect can suppress the reflection. Specifically, examples thereof include silicon-containing resist middle layer films obtained from compositions described in Japanese Unexamined Patent Application Publication Nos. 2004-310019, 2007-302873, 2009-126940, and so forth. Particularly, when a composition containing many aromatic groups and having high resistance against substrate etching is used as the organic film for 193-nm light exposure, the k value and thus the substrate reflection are increased; nevertheless, suppressing the reflection by the resist middle layer film can make the substrate reflection 0.5% or less.

Next, using a resist upper layer film composition composed of a photoresist composition, a resist upper layer film is formed on the silicon-containing resist middle layer film. The resist upper layer film composition may be a positive type or a negative type, and any generally-used photoresist composition can be used. When the resist upper layer film is formed from the photoresist composition, the spin coating method is preferably employed as in the aforementioned case of forming the resist middle layer film. After the spin coating of the photoresist composition, pre-baking is preferably performed within ranges of 60 to 180° C. and 10 to 300 seconds. Then, light exposure, post-exposure bake (PEB), and development are performed according to conventional methods to obtain a resist upper layer film pattern.

Note that the thickness of the resist upper layer film is not particularly limited, but is preferably 30 to 500 nm, particularly preferably 50 to 400 nm.

Next, a circuit pattern (resist upper layer film pattern) is formed in the resist upper layer film. The circuit pattern is preferably formed by a lithography using light with a wavelength ranging from 10 nm to 300 nm, a direct drawing by electron beam, a nanoimprinting, or a combination thereof.

In addition, the exposure light includes high energy beam with a wavelength of 300 nm or less; specifically, excimer laser of 248 nm, 193 nm, and 157 nm, soft X-ray of 3 to 20 nm, electron beam, X-ray, and the like.

Moreover, when the circuit pattern is formed, the circuit pattern is preferably developed with an alkaline solution or an organic solvent.

Next, using the resist upper layer film having the formed circuit pattern as a mask, the pattern is transferred to the silicon-containing resist middle layer film by etching. The etching of the silicon-containing resist middle layer film using the resist upper layer film pattern as a mask is preferably performed with a fluorocarbon-based gas. Thereby, a silicon-containing resist middle layer film pattern is formed.

Next, using the silicon-containing resist middle layer film having the transferred pattern as a mask, the pattern is transferred to the organic film by etching. Since the silicon-containing resist middle layer exhibits higher etching resistance to an oxygen gas or a hydrogen gas than an organic compound, the etching of the organic film using the silicon-containing resist middle layer film pattern as a mask is preferably performed with an etching gas mainly containing an oxygen gas or a hydrogen gas. Thereby, an organic film pattern is formed.

Next, using the organic film having the transferred pattern as a mask, the pattern is transferred to the body to be processed by etching. The subsequent etching of the body to be processed (layer to be processed) can be performed according to a conventional method. For example, the body to be processed made of $SiO_2$, SiN, or silica low-dielectric insulating film is etched mainly with a fluorocarbon-based gas; the body to be processed made of p-Si, Al, or W is etched mainly with a chlorine- or bromine-based gas. When the substrate is processed by etching with a fluorocarbon-based gas, the silicon-containing resist middle layer pattern is removed simultaneously with the substrate processing. Meanwhile when the substrate is processed by etching with a chlorine- or bromine-based gas, the silicon-containing resist middle layer film pattern needs to be removed by additional dry etching with a fluorocarbon-based gas after the substrate processing.

The organic film obtained from the inventive composition for forming an organic film can exhibit excellent etching resistance when the body to be processed is etched as described above.

Combination Method of 3-Layer Resist Method Using Silicon-Containing Resist Middle Layer Film with Side Wall Process Further, the present invention provides a patterning process including:

forming an organic film on a body to be processed from the above-described inventive composition for forming an organic film;

forming a silicon-containing resist middle layer film on the organic film from a silicon-containing resist middle layer film composition;

forming a resist upper layer film on the silicon containing resist middle layer film from a resist upper layer film composition composed of a photoresist composition;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Note that this method can be performed in the same manner as the above-described 3-layer resist method using the silicon-containing resist middle layer film until the pattern is formed in the organic film. After the organic film pattern is formed, a silicon oxide film, a silicon nitride film, or a silicon oxynitride film is uniformly formed on the organic film pattern by CVD. These films have dry etching selectivity relative to both of the film to be processed and the organic film. The film formed on top of the organic film pattern and at bottoms of space portions thereof is removed by etching, and then the organic film pattern is also removed by etching, thereby forming a pattern whose pattern pitch is ½ of that of the organic film pattern. Using this pattern as a mask, the pattern is transferred to the body to be processed by etching. The method for transferring the pattern to the body to be processed can be performed in the same manner as the above-described 3-layer resist method using the silicon-containing resist middle layer film, except that the silicon oxide film, the silicon nitride film, or the silicon oxynitride film having the formed pattern is used as a mask.

4-Layer Resist Method Using Silicon-Containing Resist Middle Layer Film and Organic Antireflective Film Furthermore, the present invention provides a patterning process including:

forming an organic film on a body to be processed from the above-described inventive composition for forming an organic film;

forming a silicon-containing resist middle layer film on the organic film from a resist middle layer film composition containing silicon atoms;

forming an organic antireflective film on the silicon-containing resist middle layer film;

forming a resist upper layer film on the organic antireflective film from a resist upper layer film composition composed of a photoresist composition;

forming a circuit pattern in the resist upper layer film;

transferring the pattern to the organic antireflective film and the silicon-containing resist middle layer film by etching using the resist upper layer film having the formed circuit pattern as a mask;

transferring the pattern to the organic film by etching using the silicon-containing resist middle layer film having the transferred pattern as a mask; and further transferring the pattern to the body to be processed by etching using the organic film having the transferred pattern as a mask.

Note that this method can be performed in the same manner as the above-described 3-layer resist method using the silicon-containing resist middle layer film, except that the organic antireflective film (BARC) is formed between the silicon-containing resist middle layer film and the resist upper layer film.

The organic antireflective film can be formed by spin coating from a known organic antireflective film material.

Combination Method of 4-Layer Resist Method Using Silicon-Containing Resist Middle Layer Film and Organic Antireflective Film with Side Wall Process Furthermore, the present invention provides a patterning process including:

forming an organic film on a body to be processed from the above-described inventive composition for forming an organic film;

forming a silicon-containing resist middle layer film on the organic film from a silicon-containing resist middle layer film composition;

forming an organic antireflective film on the silicon-containing resist middle layer film;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the silicon-containing resist middle layer film by etching using the resist upper layer film having the formed circuit pattern as a mask;

transferring the pattern to the organic film by etching using the silicon-containing resist middle layer film having the transferred pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Note that this method can be performed in the same manner as the above-described 4-layer resist method using the silicon-containing resist middle layer film and the organic antireflective film until the pattern is formed in the organic film. The subsequent side wall process can be performed in the same manner as the above-described combination method of the 3-layer resist method using the silicon-containing resist middle layer film with the side wall process.

3-Layer Resist Method using Inorganic Hard Mask

Furthermore, the present invention provides a patterning process according to a 3-layer resist method using the above-described inventive composition for forming an organic film, including:

forming an organic film on a body to be processed from the inventive composition for forming an organic film;

forming an inorganic hard mask selected from a silicon oxide film, a silicon nitride film, and a silicon oxynitride film on the organic film;

forming a resist upper layer film on the inorganic hard mask from a resist upper layer film composition composed of a photoresist composition;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and further transferring the pattern to the body to be processed by etching using the organic film having the formed pattern as a mask.

Note that this method can be performed in the same manner as the above-described 3-layer resist method using the silicon-containing resist middle layer film, except that the inorganic hard mask is formed in place of the silicon-containing resist middle layer film on the organic film.

The inorganic hard mask selected from a silicon oxide film, a silicon nitride film, a silicon oxynitride film (SiON film), a titanium oxide film, and a titanium nitride film can be formed by a CVD method, an ALD method, or the like. The method for forming the silicon nitride film is described in, for example, Japanese Unexamined Patent Application Publication No. 2002-334869, International Publication No. 2004/066377, and so forth. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the underlayer film needs to withstand the temperature of 300 to 500° C. Since the organic film formed from the inventive composition for forming an organic film has high heat resistance and can withstand high temperatures of 300° C. to 500° C., this enables the combination of the inorganic hard mask formed by a CVD method or an ALD method with the organic film formed by a spin coating method.

Combination Method of 3-Layer Resist Method using Inorganic Hard Mask with Side Wall Process Furthermore, the present invention provides a patterning process including:

forming an organic film on a body to be processed from the above-described inventive composition for forming an organic film;

forming an inorganic hard mask selected from a silicon oxide film, a silicon nitride film, and a silicon oxynitride film on the organic film;

forming a resist upper layer film on the inorganic hard mask from a resist upper layer film composition composed of a photoresist composition;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and transferring the pattern to the body to be processed by etching using the silicon oxide film, the silicon nitride film, or the silicon oxynitride film having the formed pattern as a mask.

Note that this method can be performed in the same manner as the above-described 3-layer resist method using the inorganic hard mask until the pattern is formed in the organic film. The subsequent side wall process can be performed in the same manner as the above-described combination method of the 3-layer resist method using the silicon-containing resist middle layer film with the side wall process.

4-Layer Resist Method using Inorganic Hard Mask and Organic Antireflective Film

Furthermore, the present invention provides a patterning process according to a 4-layer resist method using the above-described inventive composition for forming an organic film, including:

forming an organic film on a body to be processed from the inventive composition for forming an organic film;

forming an inorganic hard mask selected from a silicon oxide film, a silicon nitride film, a silicon oxynitride film, a titanium oxide film, and a titanium nitride film on the organic film;

forming an organic antireflective film on the inorganic hard mask;

forming a resist upper layer film on the organic antireflective film from a resist upper layer film composition composed of a photoresist composition;

forming a circuit pattern in the resist upper layer film;

transferring the pattern to the organic antireflective film and the inorganic hard mask by etching using the resist upper layer film having the formed circuit pattern as a mask;

transferring the pattern to the organic film by etching using the inorganic hard mask having the transferred pattern as a mask; and further transferring the pattern to the body to be processed by etching using the organic film having the transferred pattern as a mask.

Note that this method can be performed in the same manner as the above-described 3-layer resist method using the inorganic hard mask, except that the organic antireflective film (BARC) is formed between the inorganic hard mask and the resist upper layer film.

Particularly, when the SiON film is used as the inorganic hard mask, two antireflective films including the SiON film and the BARC make it possible to suppress the reflection even in liquid immersion exposure at a high NA exceeding 1.0. Another merit of forming the BARC is having an effect of reducing footing of the resist upper layer film pattern immediately above the SiON film.

Combination Method of 4-Layer Resist Method using Inorganic Hard Mask and Organic Antireflective Film with Side Wall Process Furthermore, the present invention provides a patterning process including:

forming an organic film on a body to be processed from the above-described inventive composition for forming an organic film;

forming an inorganic hard mask selected from a silicon oxide film, a silicon nitride film, and a silicon oxynitride film on the organic film;

forming an organic antireflective film on the inorganic hard mask;

forming a resist upper layer film on the organic antireflective film from a resist upper layer film composition composed of a photoresist composition, so that a 4-layered film structure is constructed;

forming a circuit pattern in the resist upper layer film;

transferring the pattern to the organic antireflective film and the inorganic hard mask by etching using the resist upper layer film having the formed circuit pattern as a mask;

transferring the pattern to the organic film by etching using the inorganic hard mask having the formed pattern as a mask;

further forming a silicon oxide film, a silicon nitride film, or a silicon oxynitride film on the organic film having the transferred pattern by CVD or ALD;

removing the organic-film patterned portion by etching, so that a pattern pitch is made ½ of that of the pattern transferred to the organic film; and then transferring the pattern to the body to be processed by etching using the silicon oxide film, the silicon nitride film, or the silicon oxynitride film having the formed pattern as a mask.

Note that this method can be performed in the same manner as the above-described 4-layer resist method using the inorganic hard mask and the organic antireflective film until the pattern is formed in the organic film. The subsequent side wall process can be performed in the same manner as the above-described combination method of the 3-layer resist method using the silicon-containing resist middle layer film with the side wall process.

Herein, FIG. 1 (A) to (F) illustrate an example of the inventive patterning process according to the 3-layer resist method. In the 3-layer resist method as shown in FIG. 1 (A), using the inventive composition for forming an organic film, an organic film 3 is formed on a layer 2 to be processed formed on a substrate 1. Then, a silicon-containing resist middle layer film 4 is formed on the organic film 3, and a resist upper layer film 5 is formed on the silicon-containing resist middle layer film 4.

Subsequently, as shown in FIG. 1 (B), an exposed portion 6 of the resist upper layer film 5 is exposed to light, followed by PEB. Thereafter, as shown in FIG. 1 (C), a resist upper layer film pattern 5a is formed by development. After that, as shown in FIG. 1 (D), using the resist upper layer film pattern 5a as a mask, the silicon-containing resist middle layer film 4 is processed by etching with a CF-based gas. Thereby, a silicon-containing resist middle layer film pattern 4a is formed. Then, as shown in FIG. 1 (E), after the resist upper layer film pattern 5a is removed, the organic film 3 is etched with oxygen plasma using the silicon-containing resist middle layer film pattern 4a as a mask. Thereby, an organic film pattern 3a is formed. Further, as shown in FIG. 1 (F), after the silicon-containing resist middle layer film pattern 4a is removed, the layer 2 to be processed is processed by etching using the organic film pattern 3a as a mask. The remaining organic film pattern 3a is removed. Thus, a pattern 2a is formed on the substrate.

In the case where an inorganic hard mask is formed, the silicon-containing resist middle layer film 4 may be replaced with the inorganic hard mask. In the case where a BARC is formed, the BARC may be formed between the silicon-containing resist middle layer film 4 and the resist upper layer film 5. The BARC may be etched continuously and before the etching of the silicon-containing resist middle layer film 4. Alternatively, after the BARC is etched alone, the silicon-containing resist middle layer film may be etched, for example, after an etching apparatus is changed.

Further, FIGS. 2 (A) to (H) illustrate an example of the process of halving a pattern pitch by a combination of the 3-layer process and a side wall process.

As in the 3-layer process, using the inventive composition for forming an organic film, the organic film 3 is formed on the layer 2 to be processed formed on the substrate 1 as shown in FIG. 2 (A). Then the silicon-containing resist middle layer film 4 is formed on the organic film 3, and the resist upper layer film 5 is formed on the silicon-containing resist middle layer film 4.

Subsequently, as shown in FIG. 2 (B), the exposed portion 6 of the resist upper layer film 5 is exposed to light, followed by PEB. Thereafter, as shown in FIG. 2 (C), the resist upper layer film pattern 5*a* is formed by development. After that, as shown in FIG. 2 (D), using the resist upper layer film pattern 5*a* as a mask, the silicon-containing resist middle layer film 4 is processed by etching with a CF-based gas. Thereby, the silicon-containing resist middle layer film pattern 4*a* is formed. Then, as shown in FIG. 2 (E), after the resist upper layer film pattern 5*a* is removed, the organic film 3 is etched with oxygen plasma using the silicon-containing resist middle layer film pattern 4*a* as a mask. Thereby, the organic film pattern 3*a* is formed.

Further, as shown in FIG. 2 (F), after the silicon-containing resist middle layer film pattern 4*a* is removed, a material having dry etching selectivity relative to both of the film 2 to be processed and the organic film 3 is uniformly formed on the organic film pattern 3*a* by CVD with the organic film pattern 3*a* serving as the core material.

Subsequently, as shown in FIG. 2 (G), a CVD film 7 is removed from the top of the organic film pattern 3*a* and at bottoms of space portions thereof by dry etching, and the organic film pattern 3*a* serving as the core material is removed by dry etching. Thus, a CVD pattern 7*a* is formed whose pattern pitch is reduced to ½. Further, as shown in FIG. 2 (H), the layer 2 to be processed is processed by dry etching using the CVD pattern 7*a* as a mask. The remaining CVD pattern 7*a* is removed. Thus, the pattern 2*a* is formed on the substrate.

In the case where an inorganic hard mask is formed, the silicon-containing resist middle layer film 4 may be replaced with the inorganic hard mask. In the case where a BARC is formed, the BARC may be formed between the silicon-containing resist middle layer film 4 and the resist upper layer film 5. The BARC may be etched continuously and before the etching of the silicon-containing resist middle layer film 4. Alternatively, after the BARC is etched alone, the silicon-containing resist middle layer film 4 may be etched, for example, after an etching apparatus is changed.

As described above, the inventive patterning processes make it possible to precisely form a fine pattern in a body to be processed by the multilayer resist methods.

EXAMPLE

Hereinafter, the present invention will be more specifically described by referring to Synthesis Examples, Examples, and Comparative Examples. However, the present invention is not limited to these descriptions. Note that, as molecular weight and dispersity, weight average molecular weight (Mw) and number average molecular weight (Mn) were measured in terms of polystyrene by gel permeation chromatography (GPC). Then, the dispersity (Mw/Mn) was calculated therefrom.

Synthesis Example 1

In 3000 g of propylene glycol methyl ether (hereinafter, PGME), 1000 g of commercially available 1,5-dihydroxynaphthalene (hereinafter, 15DHN, sulfur content: 450 ppm, measured by ICP-OES) was dissolved. To this, 500 g of neutral alumina (manufactured by Tomita Pharmaceutical Co., Ltd., Tomita-AD-250NS, particle diameters: 60 to 250 μm, pH: 7.5) was added and stirred at room temperature for 3 hours. Then, the neutral alumina was separated by filtration, and the resulting 15DHN solution in PGME was concentrated. Thus, 998 g of the 15DHN was obtained. The sulfur content of this 15DHN was measured by ICP-OES and found to be 50 ppm.

Next, in a 1000-ml flask, 80 g (0.5 moles) of she 15DHN thus treated with the neutral alumina was mixed with 5 g of p-toluenesulfonic acid and 150 g of methyl cellosolve. While the mixture was being stirred at 70° C., 67.5 g of a 20 wt % paraformaldehyde-methyl cellosolve solution was added thereto. The temperature was raised to 85° C., and the mixture was stirred for 6 hours, then cooled to room temperature, and diluted with 800 ml of ethyl acetate. The resultant was transferred to a separation funnel and washed with 200 ml of deionized water repeatedly to remove the reaction catalyst and metal impurities. After the resulting solution was concentrated under reduced pressure, 600 ml of ethyl acetate was added to the residue, and a polymer was precipitated using 2400 ml of hexane. The precipitated polymer was separated by filtration, collected, and then dried under reduced pressure. Thus, a polymer 1 as shown by the following formula was obtained. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 3,500, the dispersity (Mw/Mn) was 2.01, and the sulfur content was 45 ppm.

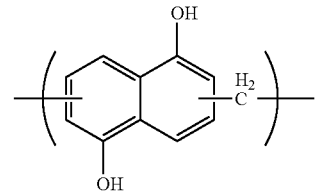

Polymer 1

In the formula, "n" represents the number of repeating units, ranging from 2 to 100.

Synthesis Example 2

A polymer 2 was obtained according to the same reactions in Synthesis Example 1, except that 15DHN not treated with neutral alumina was used in the reactions. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 3,600, the dispersity (Mw/Mn) was 2.03, and the sulfur content was 435 ppm.

Synthesis Example 3

In 3000 g of PGME, 1000 g of commercially available 2,7-dihydroxynaphthalene (hereinafter, 27DHN, sulfur content: 650 ppm, measured by ICP-OES) was dissolved. To this, 500 g of neutral alumina was added and stirred at room temperature for 3 hours. Then, the neutral alumina was separated by filtration, and the resulting 27DHN solution in PGME was concentrated. Thus, 981 g of the 27DHN was obtained. The sulfur content of this 27DHN was measured by ICP-OES and found to be 45 ppm.

Next, in a 1000-ml flask, 80 g (0.5 moles) of the 27DHN thus treated with the neutral alumina was mixed with 5 g of p-toluenesulfonic acid and 150 g of methyl cellosolve. While the mixture was being stirred at 70° C., 67.5 g of a 20 wt % paraformaldehyde-methyl cellosolve solution was added thereto. The temperature was raised to 110° C., and the mixture was stirred for 6 hours, then cooled to room temperature, and diluted with 800 ml of ethyl acetate. The resultant was transferred to a separation funnel and washed with 200 ml of deionized water repeatedly to remove the reaction catalyst and metal impurities. After the resulting solution was concentrated under reduced pressure, 600 ml of ethyl acetate was added to the residue, and a polymer was precipitated using 2400 ml of hexane. The precipitated polymer was separated by filtration, collected, and then dried under reduced pressure. Thus, a polymer 3 as shown by the following formula was obtained. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 3,100, the dispersity (Mw/Mn) was 1.99, and the sulfur content was 40 ppm.

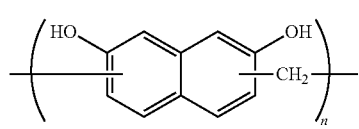

polymer 3

In the formula, "n" represents the number of repeating units, ranging from 2 to 100.

Synthesis Example 4

A polymer 4 was obtained according to the same reactions in Synthesis Example 3, except that 27DHN not treated with neutral alumina was used in the reactions. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 3,150, the dispersity (Mw/Mn) was 2.00, and the sulfur content was 530 ppm.

Synthesis Example 5

Into a 1000-ml flask, 80 g (0.5 moles) of the 15DHN purified in Synthesis Example 1, 36.7 g (0.3 moles) of 4-hydroxybenzaldehyde, and 140 g of methyl cellosolve were charged. While the mixture was being stirred at 70'C, 20 g of a 20 wt % p-toluenesulfonic acid-methyl cellosolve solution was added thereto. The temperature was raised to 35° C., and the mixture was stirred for 6 hours, then cooled to room temperature, and diluted with 800 ml of ethyl acetate. The resultant was transferred to a separation funnel and washed with 200 ml of deionized water repeatedly to remove the reaction catalyst and metal impurities. After the resulting solution was concentrated under reduced pressure, 600 ml of ethyl acetate was added to the residue, and a polymer was precipitated using 2400 ml of hexane. The precipitated polymer was separated by filtration, collected, and then dried under reduced pressure. Thus, a polymer 5 as shown by the following formula was obtained. The molecular weight (Mw) and the dispersity (Mw/Mn) of the obtained polymer in terms of polystyrene were measured by gel permeation chromatography (GPC). The molar ratio of the 15DHN (a) and 4-hydroxybenzaldehyde (b) in the polymer 5 was measured by $^1$H-NMR analysis, and the sulfur content was measured by ICP-OES. As a result, the molecular weight (Mw) was 3,300, the dispersity (Mw/Mn) was 2.39, (a)/(b) was 0.61/0.39, and the sulfur content was 70 ppm.

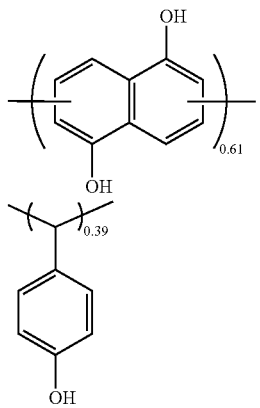

polymer 5

Synthesis Example 6

A polymer 6 was obtained according to the same reactions in Synthesis Example 5, except that 15DHN not treated with neutral alumina was used in the reactions. The molecular weight (Mw) and the dispersity (Mw/Mn) of the obtained polymer in terms of polystyrene were measured by gel permeation chromatography (GPC). The molar ratio of the 15DHN (a) and 4-hydroxybenzaldehyde (b) in the polymer 6 was measured by $^1$H-NMR analysis, and the sulfur content was measured by ICP-OES. As a result, the molecular weight (Mw) was 3,380, the dispersity (Mw/Mn) was 2.40, (a)/(b) was 0.61/0.39, and the sulfur content was 410 ppm.

Synthesis Example 7

In a 500-ml flask, 40 g of the polymer 1 was mixed with 35 g of potassium carbonate and 200 g of dimethyl formamide. This mixture was heated to 60° C., and 60 g of propargyl bromide was added thereto over 30 minutes. Then, the mixture was heated to 80° C. and continuously stirred for 10 hours. Next, the temperature was cooled to room temperature, and the mixture was diluted with 300 ml of methyl isobutyl ketone. The resultant was transferred to a separation funnel and washed with 150 ml of deionized water repeatedly to remove metal impurities. After the resulting solution was concentrated under reduced pressure, 200 ml of ethyl acetate was added to the residue, and a polymer was precipitated using 1500 ml of hexane. The precipitated polymer was separated by filtration, collected, and then dried under reduced pressure. Thus, a polymer as shown by the following formula was obtained. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 4,100, the dispersity (Mw/Mn) was 1.99, and the sulfur content was 40 ppm.

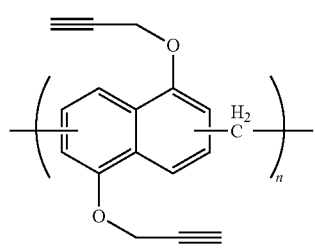

polymer 7

In the formula, "n" represents the number of repeating units, ranging from 2 to 100.

Synthesis Example 8

A polymer 8 was obtained by the same method as in Synthesis Example 7, except that the polymer 2 was used in place of the polymer 1 in Synthesis Example 7. The molecular weight (Mw) and the dispersity (Mw/Mn) of the obtained polymer in terms of polystyrene were measured by gel permeation chromatography (GPC). The sulfur content was measured by ICP-OES. As a result, the molecular weight (Mw) was 4,100, the dispersity (Mw/Mn) was 2.00, and the sulfur content was 420 ppm.

Examples, Comparative Examples

Preparation of Compositions for Forming Organic Film

Examples 1-1 to 1-12, Comparative Examples 1-1 to 1-12

The polymers 1 to 8 and various additives were blended into compositions shown in Table 1 below (the units in the parentheses are kilogram), and filtered through a nylon filter having a 10 inch (250 mm) size with 20 nm openings by using a production facility for a composition for forming an organic underlayer film Thus, compositions for forming an organic film were produced (SOL-1 to -12).

TABLE 1

| SOL | Polymer | Cross-linking agent | Acid generator | Surfactant | Solvent |
|---|---|---|---|---|---|
| SOL-1 | polymer 1 (1) | — | — | SF1 (0.005) | PGMEA (25) |
| SOL-2 | polymer 1 (1) | CL1 (0.1) | AG1 (0.01) | SF1 (0.005) | PGMEA (25) |
| SOL-3 | polymer 2 (1) | — | — | SF1 (0.005) | PGMEA (25) |
| SOL-4 | polymer 2 (1) | CL2 (0.1) | AG1 (0.01) | SF1 (0.005) | PGMEA (25) |

TABLE 1-continued

| SOL | Polymer | Cross-linking agent | Acid generator | Surfactant | Solvent |
|---|---|---|---|---|---|
| SOL-5 | polymer 3 (1) | — | — | SF1 (0.005) | PGMEA (25) |
| SOL-6 | polymer 3 (1) | CL1 (0.1) | AG1 (0.01) | SF1 (0.005) | PGMEA (25) |
| SOL-7 | polymer 4 (1) | — | — | SF1 (0.005) | PGMEA (25) |
| SOL-8 | polymer 4 (1) | CL1 (0.1) | AG1 (0.01) | SF1 (0.005) | PGMEA (25) |
| SOL-9 | polymer 5 (1) | CL1 (0.1) | AG1 (0.01) | SF1 (0.005) | PGMEA (25) |
| SOL-10 | polymer 6 (1) | CL1 (0.1) | AG1 (0.01) | SF1 (0.005) | PGMEA (25) |
| SOL-11 | polymer 7 (1) | — | — | SF1 (0.5) | PGMEA (25) |
| SOL-12 | polymer 8 (1) | — | — | SF1 (0.5) | PGMEA (25) |

The crosslinking agents CL1, CL2, the acid generator AG1, and the surfactant SF1 used were as follows.

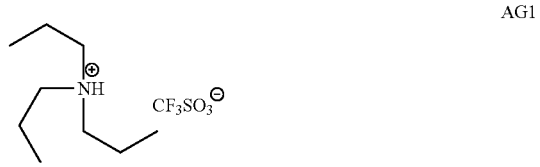

AG1

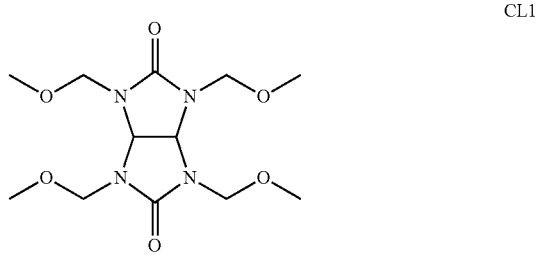

CL1

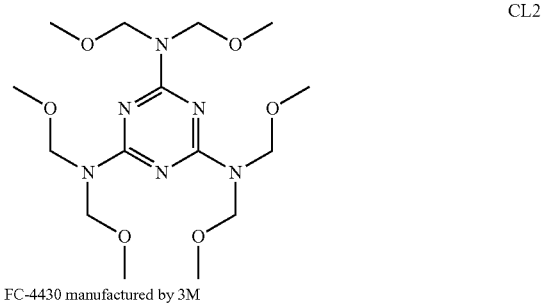

CL2

SF-1: FC-4430 manufactured by 3M

The flow speeds during the filtration with the filter and the pressure differences between before and after the filter are shown in Table 2.

TABLE 2

| Composition | SOL | Sulfur content in resin | Flow speed during filtration | Pressure difference between before and after filter |
|---|---|---|---|---|
| UL1-1 | SOL-1 | 45 ppm | 300 g/min. | 11 KPa |
| UL1-2 | SOL-1 | 45 ppm | 800 g/min. | 30 KPa |
| UL2-1 | SOL-2 | 45 ppm | 300 g/min. | 10 KPa |
| UL2-2 | SOL-2 | 45 ppm | 800 g/min. | 29 KPa |

TABLE 2-continued

| Composition | SOL | Sulfur content in resin | Flow speed during filtration | Pressure difference between before and after filter |
|---|---|---|---|---|
| UL3-1 | SOL-3 | 435 ppm | 300 g/min. | 40 KPa |
| UL3-2 | SOL-3 | 435 ppm | 800 g/min. | 100 KPa |
| UL4-1 | SOL-4 | 435 ppm | 300 g/min. | 39 KPa |
| UL4-2 | SOL-4 | 435 ppm | 800 g/min. | 100 KPa |
| UL5-1 | SOL-5 | 40 ppm | 300 g/min. | 15 KPa |
| UL5-2 | SOL-5 | 40 ppm | 800 g/min. | 30 KPa |
| UL6-1 | SOL-6 | 40 ppm | 300 g/min. | 14 KPa |
| UL6-2 | SOL-6 | 40 ppm | 800 g/min. | 33 KPa |
| UL7-1 | SOL-7 | 580 ppm | 300 g/min | 45 KPa |
| UL7-2 | SOL-7 | 580 ppm | 800 g/min. | 105 KPa |
| UL8-1 | SOL-8 | 580 ppm | 300 g/min. | 48 KPa |
| UL8-2 | SOL-8 | 580 ppm | 800 g/min. | 119 KPa |
| UL9-1 | SOL-9 | 70 ppm | 300 g/min. | 12 KPa |
| UL9-2 | SOL-9 | 70 ppm | 800 g/min. | 31 KPa |
| UL10-1 | SOL-10 | 410 ppm | 300 g/min. | 42 KPa |
| UL10-2 | SOL-10 | 410 ppm | 800 g/min. | 110 KPa |
| UL11-1 | SOL-11 | 40 ppm | 300 g/min. | 9 KPa |
| UL11-2 | SOL-11 | 40 ppm | 800 g/min. | 25 KPa |
| UL12-1 | SOL-12 | 420 ppm | 300 g/min. | 35 KPa |
| UL12-2 | SOL-12 | 420 ppm | 800 g/min. | 99 KPa |

Each of the obtained compositions for forming an organic film was connected to Clean Track ACT12 manufactured by Tokyo Electron Limited, and applied onto a 12-inch (diameter: 300 mm) silicon wafer with no filter being connected to the connection pipe. The resultant was baked at 250° C. for 60 seconds to prepare a coating film. A defect with a size of 60 nm or more on the coating film was checked by defect inspection using a dark-field defect inspection system 525 manufactured by KLA-Tencor Corporation (Examples 1-1 to 1-12, Comparative Examples 1-1 to 1-12). Table 3 shows the result.

TABLE 3

| Example | Composition | Number of defects |
|---|---|---|
| Example 1-1 | UL1-1 | 10 |
| Example 1-2 | UL1-2 | 20 |
| Example 1-3 | UL2-1 | 12 |
| Example 1-4 | UL2-2 | 26 |
| Example 1-5 | UL5-1 | 9 |
| Example 1-6 | UL5-2 | 10 |
| Example 1-7 | UL6-1 | 17 |
| Example 1-8 | UL6-2 | 16 |
| Example 1-9 | UL9-1 | 9 |
| Example 1-10 | UL9-2 | 20 |
| Example 1-11 | UL11-1 | 6 |
| Example 1-12 | UL11-2 | 17 |
| Comparative Example 1-1 | UL3-1 | 313 |
| Comparative Example 1-2 | UL3-2 | 538 |
| Comparative Example 1-3 | UL4-1 | 298 |
| Comparative Example 1-4 | UL4-2 | 657 |
| Comparative Example 1-5 | UL7-1 | 267 |
| Comparative Example 1-6 | UL7-2 | 562 |
| Comparative Example 1-7 | UL8-1 | 308 |
| Comparative Example 1-8 | UL8-2 | 696 |
| Comparative Example 1-9 | UL10-1 | 441 |
| Comparative Example 1-10 | UL10-2 | 822 |
| Comparative Example 1-11 | UL12-1 | 190 |
| Comparative Example 1-12 | UL12-2 | 286 |

These results revealed that, as in Examples 1-1 to 1-12, the use of the resin which contained a sulfur content at a concentration of 100 ppm or less reduced the number of defects in the coating film prepared from the obtained composition. In contrast, as in Comparative Examples 1-1 to 1-12, the use of the resin which contained a sulfur content at a concentration exceeding 100 ppm increased the pressure difference between before and after the filter when the composition was filtered and purified. Thus, foreign matters in the composition were hardly trapped by the filter, and the inspection of the obtained composition showed a large number of defects in the composition.

Pattern Etching Test: Examples 2-1 to 2-12, Comparative Examples 2-1 to 9-12

The compositions (UL1-1 to 12-2) for forming an organic underlayer film were each applied onto a Si wafer substrate having a diameter of 300 mm on which a $SiO_2$ film having a thickness of 100 nm had been formed. The resultant was baked at 250° C. for 60 seconds. Thereby, an organic underlayer film having a thickness of 100 nm was formed. A composition SOG1 for forming a silicon-containing resist middle layer film containing a silicon-containing resist middle layer film polymer was applied thereon and baked at 220° C. for 60 seconds Thereby, a silicon-containing resist middle layer film having a thickness of 35 nm was formed. A resist upper layer film composition (SL resist solution for ArF) was applied thereon and baked at 105° C. for 60 seconds to form a resist upper layer film having a thickness of 100 nm. A liquid immersion top coat (TC1) was applied on the resist upper layer film and baked at 90° C. for 60 seconds to form a top coat having a thickness of 50 nm. The upper layer resist was prepared by: dissolving a resin, an acid generator, and a base compound in a composition shown in Table 4 into a solvent containing 0.1 mass % FC-4430 (manufactured by Sumitomo 3M Ltd. and filtering the solution through a 0.1-μm filter made of a fluorinated resin.

TABLE 4

| No. | Polymer (parts by mass) | Acid generator (parts by mass) | Base (parts by mass) | Solvent (parts by mass) |
|---|---|---|---|---|
| SL resist for ArF | ArF monolayer resist polymer 1 (100) | PAG1 (6.6) | Amine1 (0.8) | PGMEA (2,500) |

The ArF monolayer resist polymer 1 used has structures shown below.

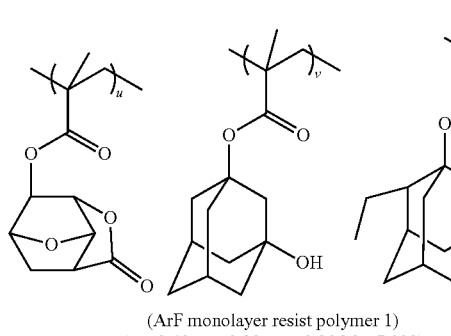

(ArF monolayer resist polymer 1)
(u = 0.40, v = 0.30, w = 0.30 Mw 7,800)

The structures of Amine1 and PAG1 used as the base and the acid generator are shown below.

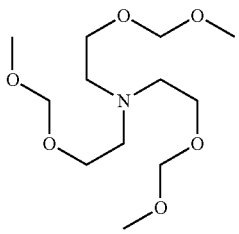

Amine 1

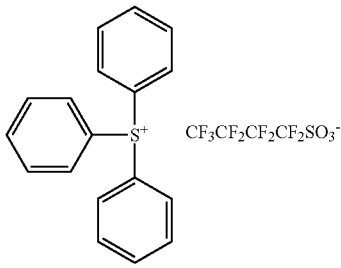

PAG1

For the composition SOG1 for forming a silicon-containing resist middle layer film, PGMEA and 2-methoxypropyl acetate were used as the solvents. The silicon-containing resist middle layer film polymer has structures shown below.

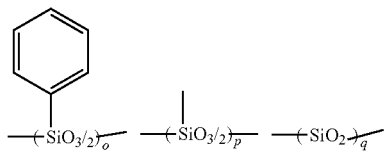

silicon-containing resist middle layer film polymer
(o = 0.05, p = 0.45, q = 0.50, Mw = 3,500)

The liquid immersion top coat (TC1) was prepared by: dissolving a resin of a composition shown in Table 5 into solvents; and filtering the solution through a 0.1-μm filter made of a fluorinated resin.

Top coat polymer

Molecular weight (Mw)=8,800

Dispersity (Mw/Mn)=1.69

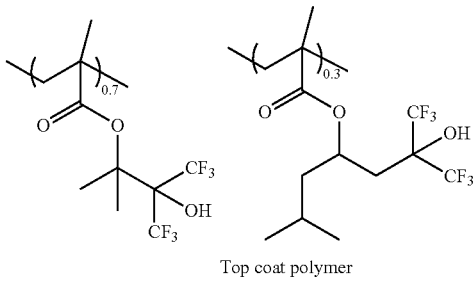

Top coat polymer

TABLE 5

| | Polymer (parts by mass) | Organic solvent (parts by mass) |
|---|---|---|
| TC1 | top coat polymer (100) | diisoamyl ether (2700) 2-methyl-1-butanol (270) |

Next, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (FEB), and developed with a 2.38 mass % tetramethylammonium hydroxide (TMAH) aqueous solution for 30 seconds. Thus, a positive line and space pattern was obtained with the resist line width of 50 nm at a pitch of 100 nm.

Table 6 shows the result of the defect inspection performed on the obtained patterns with a bright-field defect inspection system 2900 manufactured by KLA-Tencor Corporation.

TABLE 6

| Example | Composition | Number of defects |
|---|---|---|
| Example 2-1 | UL1-1 | 58 |
| Example 2-2 | UL1-2 | 71 |
| Example 2-3 | UL2-1 | 55 |
| Example 2-4 | UL2-2 | 69 |
| Example 2-5 | UL5-1 | 50 |
| Example 2-6 | UL5-2 | 32 |
| Example 2-7 | UL6-1 | 44 |
| Example 2-8 | UL6-2 | 19 |
| Example 2-9 | UL9-1 | 33 |
| Example 2-10 | UL9-2 | 41 |
| Example 2-11 | UL11-1 | 28 |
| Example 2-12 | UL11-2 | 47 |
| Comparative Example 2-1 | UL3-1 | 865 |
| Comparative Example 2-2 | UL3-2 | 1121 |
| Comparative Example 2-3 | UL4-1 | 489 |
| Comparative Example 2-4 | UL4-2 | 996 |
| Comparative Example 2-5 | UL7-1 | 680 |
| Comparative Example 2-6 | UL7-2 | 972 |
| Comparative Example 2-7 | UL8-1 | 967 |
| Comparative Example 2-8 | UL8-2 | 1097 |
| Comparative Example 2-9 | UL10-1 | 760 |
| Comparative Example 2-10 | UL10-2 | 1025 |

| Example | Composition | Number of defects |
|---|---|---|
| Comparative Example 2-11 | UL12-1 | 533 |
| Comparative Example 2-12 | UL12-2 | 693 |

The above results revealed that the substrates for 3-layer resists formed by using compositions for forming an organic underlayer film, which were produced from organic underlayer film polymers having high sulfur content, had a large number of not only coating defects but also pattern defects.

Pattern Etching Test: Examples 3-1 to 3-14

The compositions (SOL-2, SOL-6, SOL-9, SOL-11) for forming an organic underlayer film were each applied onto a Si wafer substrate having a diameter of 300 mm on which a $SiO_2$ film having a thickness of 100 nm had been formed. The resultant was baked under conditions shown in Table 7. Thereby, an organic underlayer film having a thickness of 80 nm was formed. SOG1 was applied thereon and baked at 220° C. for 60 seconds. Thereby, a silicon-containing resist middle layer film having a thickness of 35 nm was formed. A resist upper layer film composition (SL resist solution for ArF) was applied thereon and baked at 105° C. for 60 seconds to form a resist upper layer film having a thickness of 100 nm. Further, TC1 was applied thereon and baked at 90° C. for 60 seconds to form a top coat having a thickness of 50 nm. Then, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds. Thus, a positive line and space pattern was obtained with the resist line width ranging from 30 nm to 50 nm at a pitch of 100 nm.

TABLE 7

| Example | Composition for forming organic underlayer film | Baking conditions |
|---|---|---|
| 3-1 | SOL2 | 1st baking: 250° C., 60 sec., in air |
| 3-2 | SOL2 | 1st baking: 180° C., 60 sec., in air<br>2nd baking: 350° C., 60 sec., in air |
| 3-3 | SOL2 | 1st baking: 250° C., 60 sec., in air<br>2nd baking: 550° C., 30 sec., in $N_2$ |
| 3-4 | SOL2 | 1st baking: 180° C., 60 sec., in air<br>2nd baking: 300° C., 60 sec., in air<br>3rd baking: 550° C., 30 sec., in $N_2$ |
| 3-5 | SOL6 | 1st baking: 250° C., 60 sec., in air |
| 3-6 | SOL6 | 1st baking: 180° C. 60 sec., in air<br>2nd baking: 350° C., 60 sec., in air |
| 3-7 | SOL6 | 1st baking: 250° C., 60 sec., in air<br>2nd baking: 550° C., 30 sec., in $N_2$ |
| 3-8 | SOL6 | 1st baking: 180° C., 60 sec., in air<br>2nd baking: 300° C., 60 sec., in air<br>3rd baking: 550° C., 30 sec., in $N_2$ |
| 3-9 | SOL9 | 1st baking: 250° C., 60 sec., in air |
| 3-10 | SOL9 | 1st baking: 180° C., 60 sec., in air<br>2nd baking: 350° C., 60 sec., in air |
| 3-11 | SOL9 | 1st baking: 180° C., 60 sec., in air<br>2nd baking: 300° C., 60 sec., in air<br>3rd baking: 550° C., 30 sec., in $N_2$ |
| 3-12 | SOL11 | 1st baking: 250° C., 60 sec., in air |
| 3-13 | SOL11 | 1st baking: 180° C., 60 sec., in air<br>2nd baking: 350° C., 60 sec., in air |
| 3-14 | SOL11 | 1st baking: 108° C., 60 sec., in air<br>2nd baking: 300° C., 60 sec., in air<br>3rd baking: 550° C., 30 sec., in $N_2$ |

Next, the silicon-containing middle layer was processed by dry etching using the resist pattern as a mask with an etching apparatus Telius manufactured by Tokyo Electron Limited. The underlayer film was processed using the silicon-containing middle layer using as a mask. The $SiO_2$ film was processed using the underlayer film as a mask.

The etching conditions were as described below.

Conditions for Transferring the Resist Pattern to the SOG Film

| | |
|---|---|
| Chamber pressure | 10.0 Pa |
| RF power | 1,500 W |
| $CF_4$ gas flow rate | 15 sccm |
| $O_2$ gas flow rate | 75 sccm |
| Time | 15 sec. |

Conditions for Transferring the SOG Film to the Underlayer Film

| | |
|---|---|
| Chamber pressure | 2.0 Pa |
| RF power | 500 W |
| Ar gas flow rate | 75 sccm |
| $O_2$ gas flow rate | 45 sccm |
| Time | 120 sec. |

Transferring Conditions to the $SiO_2$ Film

| | |
|---|---|
| Chamber pressure | 2.0 Pa |
| RF power | 2,200 W |
| $C_5F_{12}$ gas flow rate | 20 sccm |
| $C_2F_6$ gas flow rate | 10 sccm |
| Ar gas flow rate | 300 sccm |
| $O_2$ | 60 sccm |
| Time | 90 sec. |

The pattern cross sections were observed with an electron microscope (S-4700) manufactured by Hitachi, Ltd. The profiles were compared and summarized in Table 8.

TABLE 8

| Example | Profile after etching for transferring to organic underlayer film | Profile after etching for transferring to substrate | Minimum dimension without pattern twisting after etching for transferring to substrate |
|---|---|---|---|
| 3-1 | vertical profile | vertical profile | 33 |
| 3-2 | vertical profile | vertical profile | 28 |

TABLE 8-continued

| Example | Profile after etching for transferring to organic underlayer film | Profile after etching for transferring to substrate | Minimum dimension without pattern twisting after etching for transferring to substrate |
|---|---|---|---|
| 3-3 | vertical profile | vertical profile | 19 |
| 3-4 | vertical profile | vertical profile | 19 |
| 3-5 | vertical profile | vertical profile | 35 |
| 3-6 | vertical profile | vertical profile | 29 |
| 3-7 | vertical profile | vertical profile | 20 |
| 3-8 | vertical profile | vertical profile | 20 |
| 3-9 | vertical profile | vertical profile | 33 |
| 3-10 | vertical profile | vertical profile | 27 |
| 3-11 | vertical profile | vertical profile | 20 |
| 3-12 | vertical profile | vertical profile | 32 |
| 3-13 | vertical profile | vertical profile | 28 |
| 3-14 | vertical profile | vertical profile | 22 |

As shown in Table 8, it was revealed that the resins of the present invention are compositions for forming an organic film, enabling formation of very fine patterns when baked at high temperature. The inventive resins are suitable as cutting-edge patterning materials. Moreover, it was found that the use of the resin with a sulfur content of 100 ppm or less successfully reduced the number of defects at the time of patterning, too.

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

The invention claimed is:

1. A composition for forming an organic film, comprising a condensate (A), which is a condensation product of dihydroxynaphthalene shown by the following formula (1) and a condensation agent,
or
a derivative of the condensate (A),
wherein
a sulfur content among constituent elements contained in the condensate (A) or the derivative of the condensate (A) is 100 ppm or less in terms of mass,
the formula (1) is:

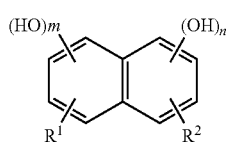
(1)

where $R^1$ and $R^2$ each independently represent a hydrogen atom or an optionally substituted, saturated or unsaturated monovalent organic group having 1 to 30 carbon atoms;

$0 \leq m \leq 2$,
$0 \leq n \leq 2$, and
$m+n=2$;
an amount of a sulfonic acid compound shown by the following formula (1-2) present in the dihydroxynaphthalene is 100 ppm or less in terms of mass and in terms of sulfur content, and
the formula (1-2) is:

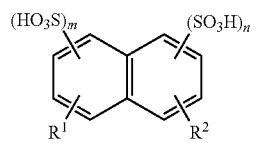
(1-2)

where n, m, $R^1$, and $R^2$ are as described above.

2. The composition for forming an organic film according to claim 1, wherein the dihydroxynaphthalene is 1,5-dihydroxynaphthalene or 2,7-dihydroxynaphthalene.

3. The composition for forming an organic film according to claim 1, wherein the condensation agent is formaldehyde, paraformaldehyde, hydroxybenzaldehyde, or hydroxynaphthylaldehyde.

4. The composition for forming an organic film according to claim 1, wherein the derivative of the condensate (A) is a condensate (B) obtained by reacting the condensate (A) with a modification agent shown by the following formula (2), $$X—R_4—C≡C—R_3 \quad (2)$$

wherein
X represents chlorine, bromine, or iodine;
$R_3$ represents hydrogen or a monovalent organic group having 1 to 10 carbon atoms; and
$R_4$ represents a divalent organic group having 1 to 10 carbon atoms.

5. The composition for forming an organic film according to claim 1, further comprising one or both of an acid generator and a crosslinking agent.

6. A substrate for manufacturing a semiconductor device, comprising an organic film on the substrate, the organic film being formed by curing the composition for forming an organic film according to claim 1.

7. A method for forming an organic film employed in a semiconductor device manufacturing process, the method comprising:
spin-coating a body to be processed with the composition for forming an organic film according to claim 1; and
heating the body to be processed coated with the composition for forming an organic film under an inert gas atmosphere at a temperature of 50° C. or higher to 600° C. or lower within a range of 10 seconds to 7200 seconds to obtain a cured film.

8. A method for forming an organic film employed in a semiconductor device manufacturing process, the method comprising:
spin-coating a body to be processed with the composition for forming an organic film according to claim 1;
heating the body to be processed coated with the composition for forming an organic film in air at a temperature of 50° C. or higher to 400° C. or lower within a range of 5 seconds to 3600 seconds to form a coating film; and
then heating the body to be processed having the formed coating film under an inert gas atmosphere at a temperature of 400° C. or higher to 600° C. or lower within a range of 10 seconds to 7200 seconds to obtain a cured film.

9. The method for forming an organic film according to claim 7, wherein the inert gas has an oxygen concentration of 1% or less.

10. A patterning process comprising:
forming an organic film on a body to be processed from the composition for forming an organic film according to claim 1;
forming a silicon-containing resist middle layer film on the organic film from a silicon-containing resist middle layer film composition;
forming a resist upper layer film on the silicon-containing resist middle layer film from a resist upper layer film composition composed of a photoresist composition;
forming a circuit pattern in the resist upper layer film;
transferring the pattern to the silicon-containing resist middle layer film by etching using the resist upper layer film having the formed circuit pattern as a mask;
transferring the pattern to the organic film by etching using the silicon-containing resist middle layer film having the transferred pattern as a mask; and
further transferring the pattern to the body to be processed by etching using the organic film having the transferred pattern as a mask.

11. A patterning process comprising:
forming an organic film on a body to be processed from the composition for forming an organic film according to claim 1;
forming a silicon-containing resist middle layer film on the organic film from a silicon-containing resist middle layer film composition;
forming a resist upper layer film on the silicon-containing resist middle layer film from a resist upper layer film composition composed of a photoresist composition;
forming a circuit pattern in the resist upper layer film;
transferring the pattern to the silicon-containing resist middle layer film by etching using the resist upper layer film having the formed circuit pattern as a mask;
transferring the pattern to the organic film by etching using the silicon-containing resist middle layer film having the transferred pattern as a mask;
further forming a silicon oxide film, a silicon nitride film, or a silicon oxynitride film on the organic film having the transferred pattern by CVD or ALD;
removing the organic-film patterned portion by etching, so that a pattern pitch is made ½ of that of the pattern transferred to the organic film; and
then transferring the pattern to the body to be processed by etching using the silicon oxide film, the silicon nitride film, or the silicon oxynitride film having the formed pattern as a mask.

12. A patterning process comprising:
forming an organic film on a body to be processed from the composition for forming an organic film according to claim 1;
forming a silicon-containing resist middle layer film on the organic film from a silicon-containing resist middle layer film composition;
forming an organic antireflective film on the silicon-containing resist middle layer film;
forming a resist upper layer film on the organic antireflective film from a resist upper layer film composition composed of a photoresist composition, so that a 4-layered film structure is constructed;
forming a circuit pattern in the resist upper layer film;
transferring the pattern to the organic antireflective film and the silicon-containing resist middle layer film by etching using the resist upper layer film having the formed circuit pattern as a mask;
transferring the pattern to the organic film by etching using the silicon-containing resist middle layer film having the transferred pattern as a mask; and
further transferring the pattern to the body to be processed by etching using the organic film having the transferred pattern as a mask.

13. A patterning process comprising:
forming an organic film on a body to be processed from the composition for forming an organic film according to claim 1;
forming a silicon-containing resist middle layer film on the organic film from a silicon-containing resist middle layer film composition;
forming an organic antireflective film on the silicon-containing resist middle layer film;
forming a resist upper layer film on the organic antireflective film from a resist upper layer film composition composed of a photoresist composition, so that a 4-layered film structure is constructed;
forming a circuit pattern in the resist upper layer film;
transferring the pattern to the organic antireflective film and the silicon-containing resist middle layer film by etching using the resist upper layer film having the formed circuit pattern as a mask;
transferring the pattern to the organic film by etching using the silicon-containing resist middle layer film having the transferred pattern as a mask;
further forming a silicon oxide film, a silicon nitride film, or a silicon oxynitride film on the organic film having the transferred pattern by CVD or ALD;
removing the organic-film patterned portion by etching, so that a pattern pitch is made ½ of that of the pattern transferred to the organic film; and
then transferring the pattern to the body to be processed by etching using the silicon oxide film, the silicon nitride film, or the silicon oxynitride film having the formed pattern as a mask.

14. A patterning process comprising:
forming an organic film on a body to be processed from the composition for forming an organic film according to claim 1;
forming an inorganic hard mask selected from a silicon oxide film, a silicon nitride film, and a silicon oxynitride film on the organic film;
forming a resist upper layer film on the inorganic hard mask from a resist upper layer film composition composed of a photoresist composition;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask; and
further transferring the pattern to the body to be processed by etching using the organic film having the formed pattern as a mask.

15. A patterning process comprising:
forming an organic film on a body to be processed from the composition for forming an organic film according to claim 1;

forming an inorganic hard mask selected from a silicon oxide film, a silicon nitride film, and a silicon oxynitride film on the organic film;
forming a resist upper layer film on the inorganic hard mask from a resist upper layer film composition composed of a photoresist composition;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask;
further forming a silicon oxide film, a silicon nitride film, or a silicon oxynitride film on the organic film having the transferred pattern by CVD or ALD;
removing the organic-film patterned portion by etching, so that a pattern pitch is made ½ of that of the pattern transferred to the organic film; and
then transferring the pattern to the body to be processed by etching using the silicon oxide film, the silicon nitride film, or the silicon oxynitride film having the formed pattern as a mask.

16. A patterning process comprising:
forming an organic film on a body to be processed from the composition for forming an organic film according to claim 1;
forming an inorganic hard mask selected from a silicon oxide film, a silicon nitride film, and a silicon oxynitride film on the organic film;
forming an organic antireflective film on the inorganic hard mask;
forming a resist upper layer film on the organic antireflective film from a resist upper layer film composition composed of a photoresist composition, so that a 4-layered film structure is constructed;
forming a circuit pattern in the resist upper layer film;
transferring the pattern to the organic antireflective film and the inorganic hard mask by etching using the resist upper layer film having the formed circuit pattern as a mask;
transferring the pattern to the organic film by etching using the inorganic hard mask having the formed pattern as a mask; and
further transferring the pattern to the body to be processed by etching using the organic film having the formed pattern as a mask.

17. A patterning process comprising:
forming an organic film on a body to be processed from the composition for forming an organic film according to claim 1;
forming an inorganic hard mask selected from a silicon oxide film, a silicon nitride film, and a silicon oxynitride film on the organic film;
forming an organic antireflective film on the inorganic hard mask;
forming a resist upper layer film on the organic antireflective film from a resist upper layer film composition composed of a photoresist composition, so that a 4-layered film structure is constructed;
forming a circuit pattern in the resist upper layer film;
transferring the pattern to the organic antireflective film and the inorganic hard mask by etching using the resist upper layer film having the formed circuit pattern as a mask;
transferring the pattern to the organic film by etching using the inorganic hard mask having the formed pattern as a mask;
further forming a silicon oxide film, a silicon nitride film, or a silicon oxynitride film on the organic film having the transferred pattern by CVD or ALD;
removing the organic-film patterned portion by etching, so that a pattern pitch is made ½ of that of the pattern transferred to the organic film; and
then transferring the pattern to the body to be processed by etching using the silicon oxide film, the silicon nitride film, or the silicon oxynitride film having the formed pattern as a mask.

18. The patterning process according to claim 14, wherein the inorganic hard mask is formed by a CVD method or an ALD method.

19. The patterning process according to claim 10, wherein the circuit pattern is formed by a lithography using light with a wavelength ranging from 10 nm to 300 nm, a direct drawing by electron beam, a nanoimprinting, or a combination thereof.

20. The patterning process according to claim 10, wherein when the circuit pattern is formed, the circuit pattern is developed with an alkaline solution or an organic solvent.

21. The patterning process according to claim 10, wherein the body to be processed is a semiconductor device substrate or the semiconductor device substrate coated with any of a metal film, a metal carbide film, a metal oxide film, a metal nitride film, a metal oxycarbide film, and a metal oxynitride film.

22. The patterning process according to claim 21, wherein the metal of the body to be processed is silicon, titanium, tungsten, hafnium, zirconium, chromium, germanium, copper, silver, gold, aluminum, indium, gallium, arsenic, palladium, iron, tantalum, iridium, molybdenum, cobalt, or an alloy thereof.

* * * * *